(12) United States Patent
Tokuhira et al.

(10) Patent No.: US 9,595,324 B1
(45) Date of Patent: Mar. 14, 2017

(54) SEMICONDUCTOR MEMORY DEVICE

(71) Applicant: Kabushiki Kaisha Toshiba, Minato-ku (JP)

(72) Inventors: Hiroki Tokuhira, Kawasaki (JP); Hiroyoshi Tanimoto, Yokohama (JP); Takashi Izumida, Yokohama (JP)

(73) Assignee: KABUSHIKI KAISHA TOSHIBA, Minato-ku (JP)

(*) Notice: Subject to any disclaimer, the term of this patent is extended or adjusted under 35 U.S.C. 154(b) by 0 days.

(21) Appl. No.: 15/070,382

(22) Filed: Mar. 15, 2016

Related U.S. Application Data

(60) Provisional application No. 62/222,288, filed on Sep. 23, 2015.

(51) Int. Cl.
| | |
|---|---|
| *G11C 13/00* | (2006.01) |
| *H01L 23/528* | (2006.01) |
| *H01L 27/24* | (2006.01) |
| *H01L 45/00* | (2006.01) |
| *G11C 11/56* | (2006.01) |

(52) U.S. Cl.
CPC ........ *G11C 13/004* (2013.01); *G11C 13/0023* (2013.01); *H01L 23/528* (2013.01); *H01L 27/249* (2013.01); *H01L 27/2436* (2013.01); *H01L 45/085* (2013.01); *H01L 45/141* (2013.01); *G11C 11/5678* (2013.01); *G11C 13/0069* (2013.01); *G11C 2013/0045* (2013.01); *G11C 2013/0078* (2013.01); *G11C 2213/11* (2013.01); *G11C 2213/71* (2013.01)

(58) Field of Classification Search
CPC ............ G11C 13/0004; G11C 13/0069; G11C 11/5678
USPC .................. 365/163, 185.17, 185.21, 185.14
See application file for complete search history.

(56) References Cited

U.S. PATENT DOCUMENTS

| | | | |
|---|---|---|---|
| 8,891,277 B2 | 11/2014 | Murooka | |
| 2009/0027955 A1* | 1/2009 | Koh | G11C 13/0007 365/163 |
| 2013/0200331 A1 | 8/2013 | Morikawa et al. | |
| 2015/0117089 A1 | 4/2015 | Minemura et al. | |

FOREIGN PATENT DOCUMENTS

| | | |
|---|---|---|
| JP | 2013-120618 | 6/2013 |
| JP | 2013-161978 | 8/2013 |
| JP | 2015-88212 | 5/2015 |

\* cited by examiner

*Primary Examiner* — Jason Lappas
(74) *Attorney, Agent, or Firm* — Oblon, McClelland, Maier & Neustadt, L.L.P.

(57) ABSTRACT

According to an embodiment, a semiconductor memory device comprises: a first wiring line; a memory string connected to this first wiring line; and a plurality of second wiring lines connected to this memory string. In addition, this memory string comprises: a first semiconductor layer connected to the first wiring line; a plurality of second semiconductor layers connected to this first semiconductor layer; and a variable resistance element connected between this second semiconductor layer and the second wiring line. Moreover, of the first semiconductor layer and the plurality of second semiconductor layers, one includes a semiconductor of a first conductivity type, and the other includes a semiconductor of a second conductivity type.

17 Claims, 26 Drawing Sheets

US 9,595,324 B1

SEMICONDUCTOR MEMORY DEVICE

CROSS-REFERENCE TO RELATED APPLICATIONS

This application is based upon and claims the benefit of U.S. Provisional Patent Application No. 62/222,288, filed on Sep. 23, 2015, the entire contents of which are incorporated herein by reference.

BACKGROUND

Field

Embodiments described herein relate to a semiconductor memory device.

Description of the Related Art

In recent years, ReRAM (Resistive RAM) that utilizes as memory a variable resistance element whose resistance value is reversibly changed, has been proposed. Moreover, due to a structure in which the variable resistance element is provided between a sidewall of a word line extending parallel to a substrate and a sidewall of a bit line extending perpendicularly to the substrate in this ReRAM, further raising of integration level of a memory cell array has been enabled. In the memory cell array having such a structure, a select gate transistor is connected to a lower end of the bit line, and each of the bit lines is selectively connected to a global bit line by this select gate transistor.

DETAILED DESCRIPTION

A semiconductor memory device according to an embodiment comprises: a first wiring line; a memory string connected to this first wiring line; and a plurality of second wiring lines connected to this memory string. In addition, this memory string comprises: a first semiconductor layer connected to the first wiring line; a plurality of second semiconductor layers connected to this first semiconductor layer; and a variable resistance element connected between this second semiconductor layer and the second wiring line. Moreover, of the first semiconductor layer and the plurality of second semiconductor layers, one includes a semiconductor of a first conductivity type, and the other includes a semiconductor of a second conductivity type.

Next, nonvolatile semiconductor memory devices according to embodiments will be described in detail with reference to the drawings. Note that these embodiments are merely examples, and are not shown with the intention of limiting the present invention.

For example, each of the drawings of the nonvolatile semiconductor memory devices employed in the embodiments below is schematic, and thicknesses, widths, ratios, and so on, of layers are different from those of the actual nonvolatile semiconductor memory devices.

Moreover, described herein is an example in which a variable resistance element employing a metal oxide is adopted as a storage element, but the present invention may also be applied to a memory device having another configuration. Such a memory device may have any configuration, for example, may be a memory device that employs CBRAM (Conduction Bridge RAM) comprising a layer which is a supply source of a metal ion and a layer which is a medium in which the metal ion moves, may be a memory device that employs a storage element utilizing a chalcogenide compound, and so on.

First Embodiment

Figure 1:
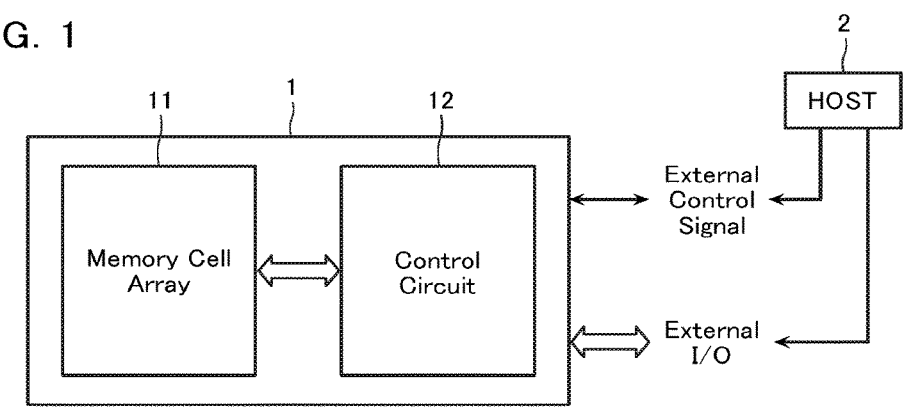
FIG. 1 is a block diagram of a nonvolatile semiconductor memory device according to a first embodiment.

First, a schematic configuration of a nonvolatile semiconductor memory device 1 according to the present embodiment will be described with reference to FIG. 1. FIG. 1 is a block diagram showing the schematic configuration of the nonvolatile semiconductor memory device 1 according to a first embodiment.

The nonvolatile semiconductor memory device 1 comprises: a memory cell array 11; and a control circuit 12 that controls this memory cell array 11. The memory cell array 11 stores user data inputted from an external host 2. The control circuit 12 receives an external control signal from the host 2, and based on this external control signal, stores user data in the memory cell array 11 and reads user data in the memory cell array 11 to be outputted to the external host 2.

Figure 2A:
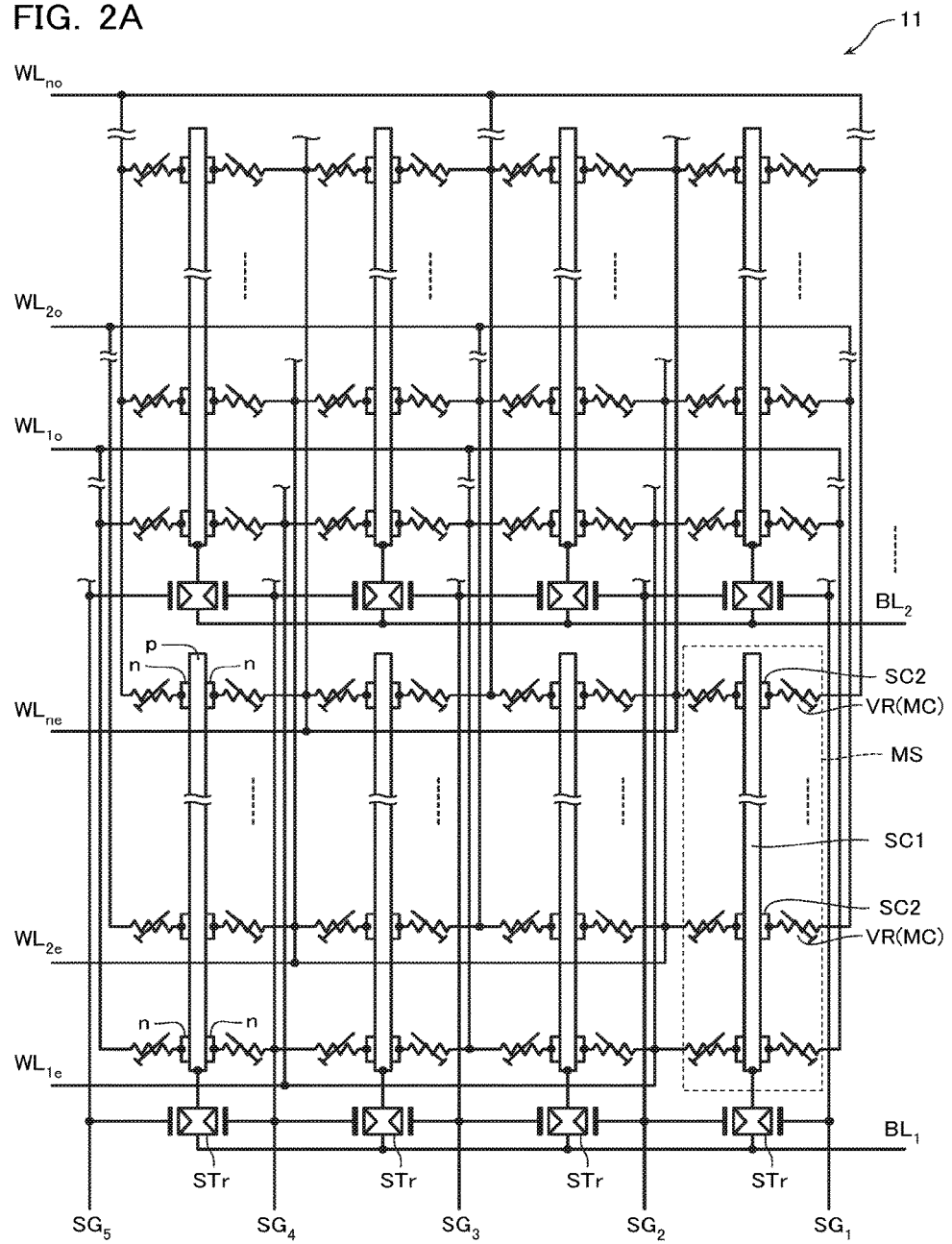
FIG. 2A is a circuit diagram showing a configuration of part of the same nonvolatile semiconductor memory device.

Next, a circuit configuration of part of the memory cell array 11 according to the present embodiment will be described with reference to FIG. 2A. FIG. 2A is an equivalent circuit diagram showing a configuration of part of the memory cell array 11.

As shown in FIG. 2A, the memory cell array 11 comprises a plurality of bit lines $BL_1$, $BL_2$, . . . . Moreover, a plurality of memory strings MS are respectively connected to these plurality of bit lines $BL_1$, $BL_2$, . . . , via a plurality of select gate transistors STr. Select gate lines $SG_1$ to $SG_5$ are respectively connected to gates of the plurality of select gate transistors STr. Moreover, a plurality of word lines $WL_{1e}$ to $WL_{ne}$ and $WL_{1o}$ to $WL_{no}$ are connected to the memory string MS. Moreover, these word lines $WL_{1e}$ to $WL_{ne}$ and $WL_{1o}$ to $WL_{no}$ are each commonly connected for a plurality (in the example shown in FIG. 2A, all) of the memory strings MS.

As shown in FIG. 2A, the memory string MS comprises: a first semiconductor layer SC1 connected to the select gate transistor STr; a plurality of second semiconductor layers SC2 connected to this first semiconductor layer SC1; and a plurality of variable resistance elements VR (memory cells MC) connected between these plurality of second semiconductor layers SC2 and the plurality of word lines $WL_{1e}$ to $WL_{ne}$ and $WL_{1o}$ to $WL_{no}$. The first semiconductor layer SC1 is formed from (includes) a p type semiconductor layer, for example. The second semiconductor layer SC2 is configured from (includes) an n type semiconductor layer, for example.

Figure 2B:
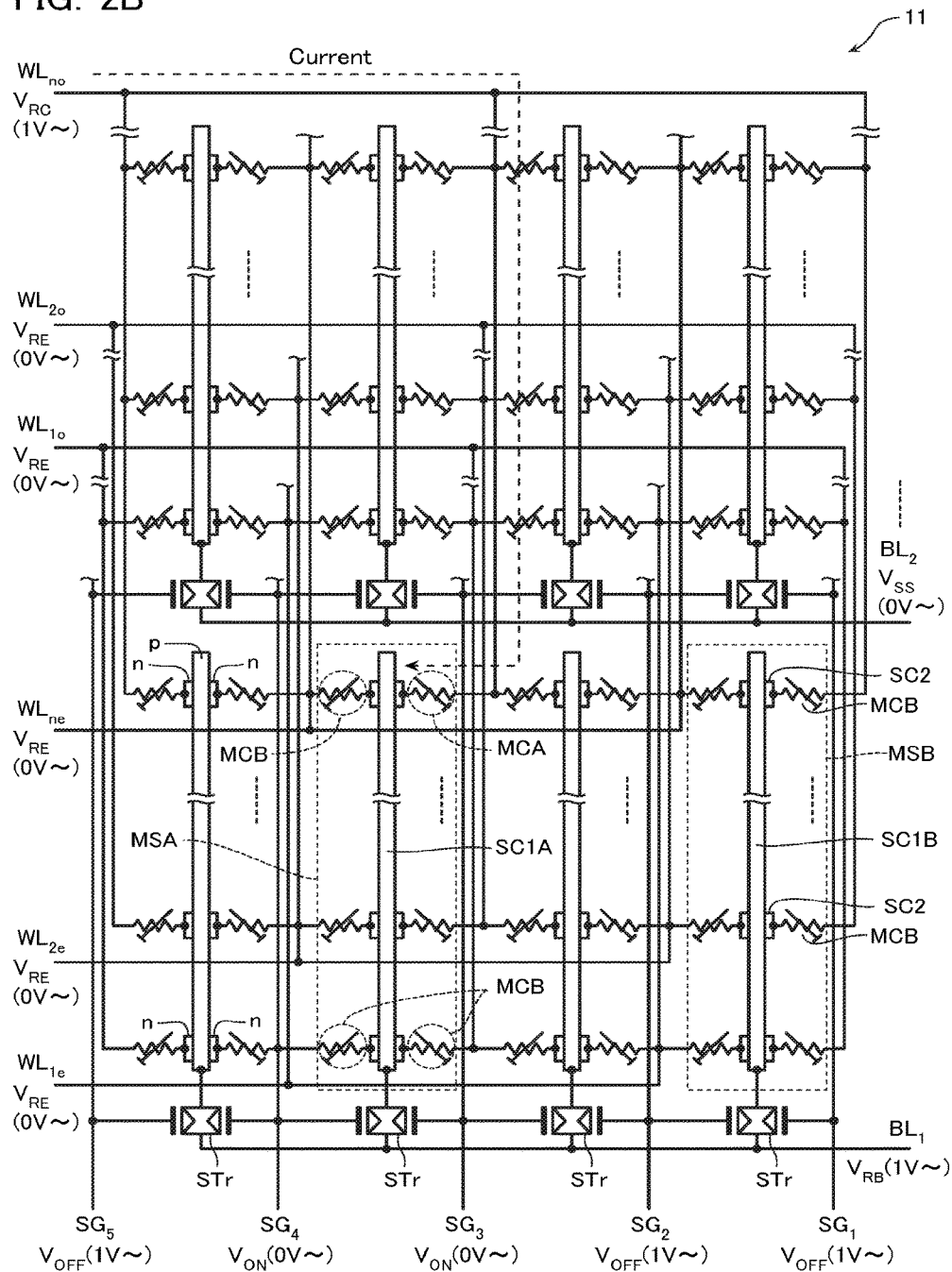
FIG. 2B is a circuit diagram for explaining a read operation of the same nonvolatile semiconductor memory device.

Next, operation of the memory cell array 11 according to the present embodiment will be described simply with reference to FIG. 2B. FIG. 2B is an equivalent circuit diagram showing a situation when a read operation is performed in the memory cell array 11 described with reference to FIG. 2A. Note that the description below describes the case of reading data from a selected memory cell MCA of a selected memory string MSA.

When reading data from the memory cell MCA, the control circuit 12 selectively applies a voltage to a first semiconductor layer SC1A of the selected memory string MSA. For example, the control circuit 12 applies an on voltage $V_{ON}$ (about 0 V) to the select gate lines $SG_3$ and $SG_4$ and an off voltage $V_{OFF}$ (about 1 V) to the select gate lines $SG_1$, $SG_2$, and $SG_5$, thereby setting the select gate transistor STr connected to the selected memory string MSA to an on state and another select gate transistor STr to an off state. Moreover, the control circuit 12 applies a read base voltage $V_{RB}$ (about 1 V) to a selected bit line $BL_1$ and a ground voltage Vss (about 0 V) smaller than the read base voltage $V_{RB}$, to an unselected bit line BL2.

Moreover, when reading data from the memory cell MCA, the control circuit 12 applies a voltage from a selected word line $WL_{no}$ to unselected word lines $WL_{1e}$ to $WL_{ne}$ and $WL_1$ to $WL_{n-1o}$, via the first semiconductor layer SC1A. For example, the control circuit 12 applies a read collector voltage $V_{RC}$ (about 1 V) to the selected word line $WL_{no}$ and a read emitter voltage $V_{RE}$ (about 0 V) to the unselected word lines $WL_{1e}$ to $WL_{ne}$ and $WL_1$ to $WL_{n-1o}$.

Now, the selected word line $WL_{no}$ and the unselected word lines $WL_{1e}$ to $WL_{ne}$ and $WL_{1o}$ to $WL_{n-1o}$ are connected via an npn junction (bipolar transistor) configured from the first semiconductor layer SC1 and the second semiconductor layer SC2. Therefore, by selectively applying a voltage to supply a base current to a desired first semiconductor layer SC1A, the selected word line $WL_{no}$ and the unselected word lines $WL_{1e}$ to $WL_{ne}$ and $WL_{1o}$ to $WL_{n-1o}$ are electrically connected via this first semiconductor layer SC1A. Therefore, a resistance value of the selected memory cell MCA can be determined by detecting a current flowing in the selected word line $WL_{no}$.

On the other hand, a first semiconductor layer SC1B of an unselected memory string MSB is not supplied with the base current. Therefore, in the unselected memory string MSB, electrical connection of fellow word lines $WL_{1e}$ to $WL_{ne}$ and $WL_{1o}$ to $WL_{no}$ can be suitably cut, and leak current can be suitably suppressed from flowing between the selected word line $WL_{no}$ and the unselected word lines $WL_{1e}$ to $WL_{ne}$ and $WL_{1o}$ to $WL_{n-1o}$. As a result, generation of a leak path parallel to a selection element (memory cell MCA) can be suppressed. This is an extremely important characteristic for performing stable read.

That is, when a plurality of word lines are commonly connected to a respective plurality of memory strings as in the present embodiment, for example, it results in the selected word line and the unselected word line being connected in parallel via the plurality of memory strings. Now, when the unselected memory string has ended up becoming a leak path, for example, a detected current ends up including the leak current flowing in the unselected memory string as well as the current flowing in the selection element. Therefore, when the number of unselected memory strings connected to the word line increases along with raising of integration level of the memory cell array, a proportion of leak current in the detected current ends up increasing and it sometimes gets difficult to determine the resistance value of the selection element from a current value.

Moreover, for example, in a cross-point type memory cell array comprising a bit line, a word line, and a variable resistance element and diode connected between the bit line and word line, such a leak current can be suppressed by the diode. However, it is sometimes difficult for such a cross-point type memory cell array to be used in combination with a so-called bipolar type variable resistance element, in which a direction of current flowing in the variable resistance element differs between when the variable resistance element is being made high resistance and when the variable resistance element is being made low resistance.

In contrast, in the present embodiment, the first semiconductor layer SC1B of the unselected memory string MSB is not supplied with the base current, hence the leak current in the unselected memory string MSB can be suppressed. As a result, the proportion of leak current in the detected current can be reduced, and stable read can be performed.

Moreover, the configuration according to the present embodiment, in contrast to a cross-point type memory cell array including a plurality of diodes, can pass a current in both directions in the variable resistance element, hence can be used in combination with a so-called bipolar type variable resistance element.

Note that in the present embodiment, the leak current is suppressed, thereby making it possible to achieve a non-volatile semiconductor memory device in which power consumption is small and generation of heat is small.

Note that exemplified herein was the read operation, but even in a write operation for writing data to the selected memory cell MCA, it is possible to block the base current to the first semiconductor layer SC1B of the unselected memory string MSB, while supplying the base current to the first semiconductor layer SC1A of the selected memory string MSA. Therefore, electrical connection of fellow word lines $WL_{1e}$ to $WL_{ne}$ and $WL_{1o}$ to $WL_{no}$ in the unselected memory string MSB can be suitably cut. As a result, unintended write due to the leak current (miswrite to a memory cell other than the write target selected memory cell) or an increase in power consumption, and so on, can be suppressed.

Moreover, in the present embodiment, the first semiconductor layer SC1 is formed from (includes) a p type semiconductor layer, and the second semiconductor layer SC2 is formed from (includes) an n type semiconductor layer. However, the first semiconductor layer SC1 may be formed from (include) an n type semiconductor layer, and the second semiconductor layer SC2 may be formed from (include) a p type semiconductor layer, for example. That is, if a conductivity type of the first semiconductor layer SC1 is assumed to be a first conductivity type, and a conductivity type of the second semiconductor layer SC2 is assumed to be a second conductivity type, then one of the first conductivity type and the second conductivity type is p type, and the other is n type.

Moreover, in the selected memory string MSA, the second semiconductor layers SC2 respectively function as an emitter or function as a collector, according to the selected memory cell MC. Therefore, the second semiconductor layers SC2 are electrically independent of each other. Moreover, if, for example, the variable resistance element (memory cell MC) connected to the second semiconductor layer SC2 functioning as the emitter is assumed to be a first variable resistance element and the variable resistance element connected to the second semiconductor layer SC2 functioning as the collector is assumed to be a second variable resistance element, then depending on a type of operation, the selected memory cell MC will sometimes be the first variable resistance element and will sometimes be the second variable resistance element.

Moreover, in the present embodiment, a field effect transistor having a channel body formed from (including) a p type semiconductor is adopted as the select gate transistor STr. As a result, a hole current can be suitably supplied to the first semiconductor layer SC1. Note that when, for example, the first semiconductor layer SC1 is formed from (includes) an n type semiconductor layer and the second semiconductor layer SC2 is formed from (includes) a p type semiconductor layer, a field effect transistor having a channel body formed from (including) an n type semiconductor may be adopted as the select gate transistor STr. In other words, the channel body of the select gate transistor STr is formed from (includes) a semiconductor of the first conductivity type, similarly to the first semiconductor layer SC1.

Moreover, when reading data from the memory cell MCA, for example, it results in a plurality of the unselected memory cells MCB being connected in parallel between the selected word line $WL_{no}$ and the unselected word lines $WL_{1e}$ to $WL_{ne}$ and $WL_{1o}$ to $WL_{n-1o}$. Therefore, if at least one of these plurality of unselected memory cells MCB is always set to a low resistance state, the resistance value of the selected memory cell MCA can be more suitably measured. Therefore, for example, it may be configured that in each of the memory strings MS, one or a plurality of the memory cells MC is always set to a low resistance state, and the other memory cells MC have user data stored therein.

Figure 3:
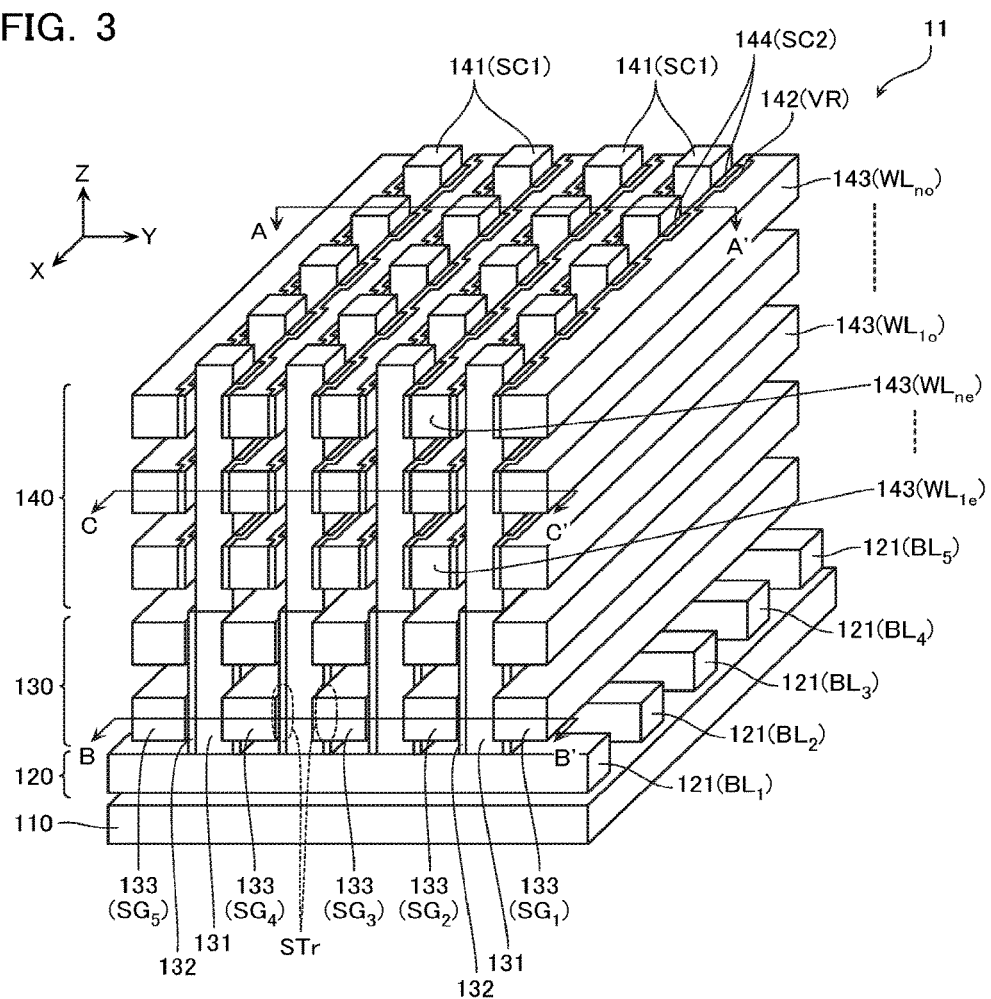
FIG. 3 is a perspective view showing a configuration of part of the same nonvolatile semiconductor memory device.
Figure 4:
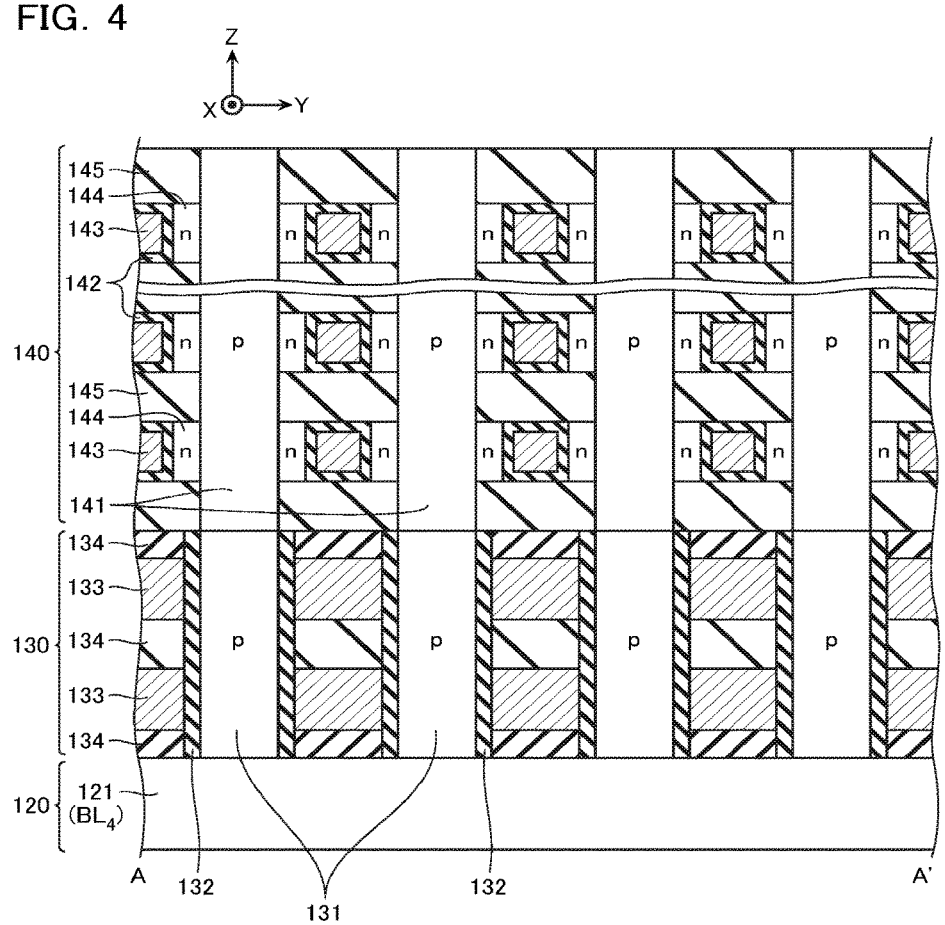
FIG. 4 is a cross-sectional view showing a configuration of part of the same nonvolatile semiconductor memory device.
Figure 5:
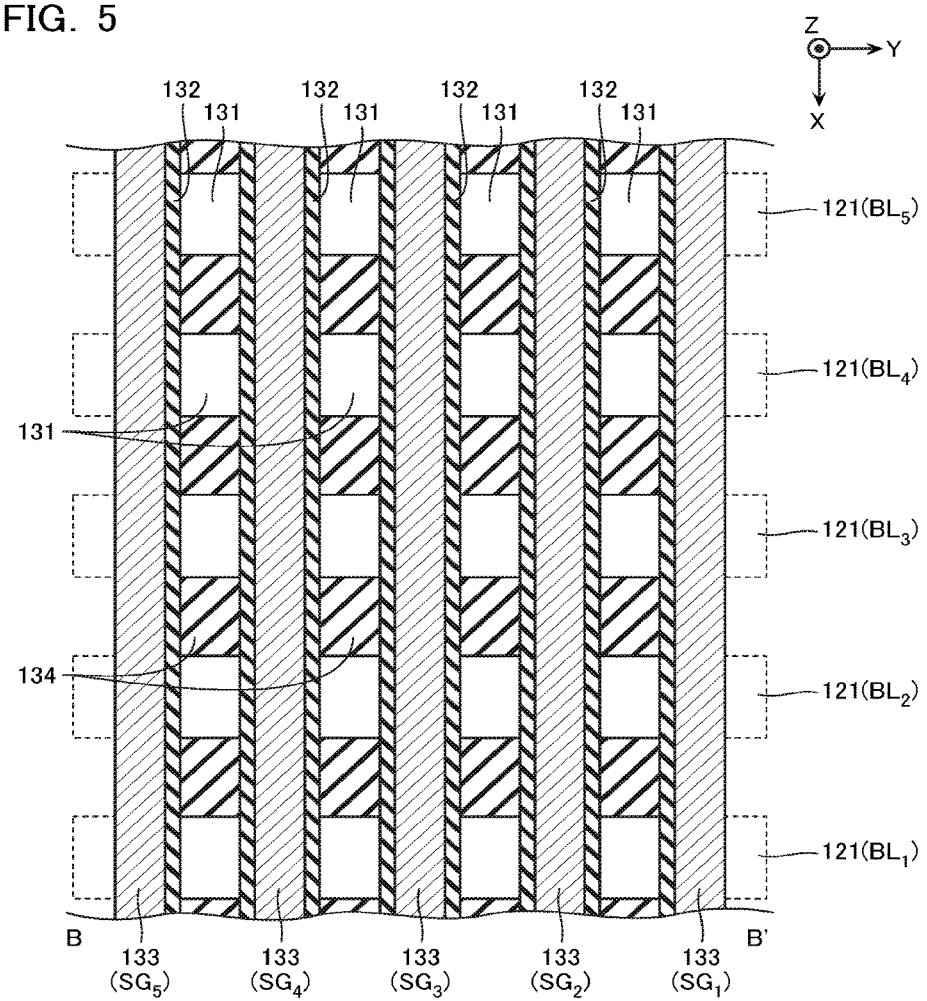
FIG. 5 is a cross-sectional view showing a configuration of part of the same nonvolatile semiconductor memory device.
Figure 6:
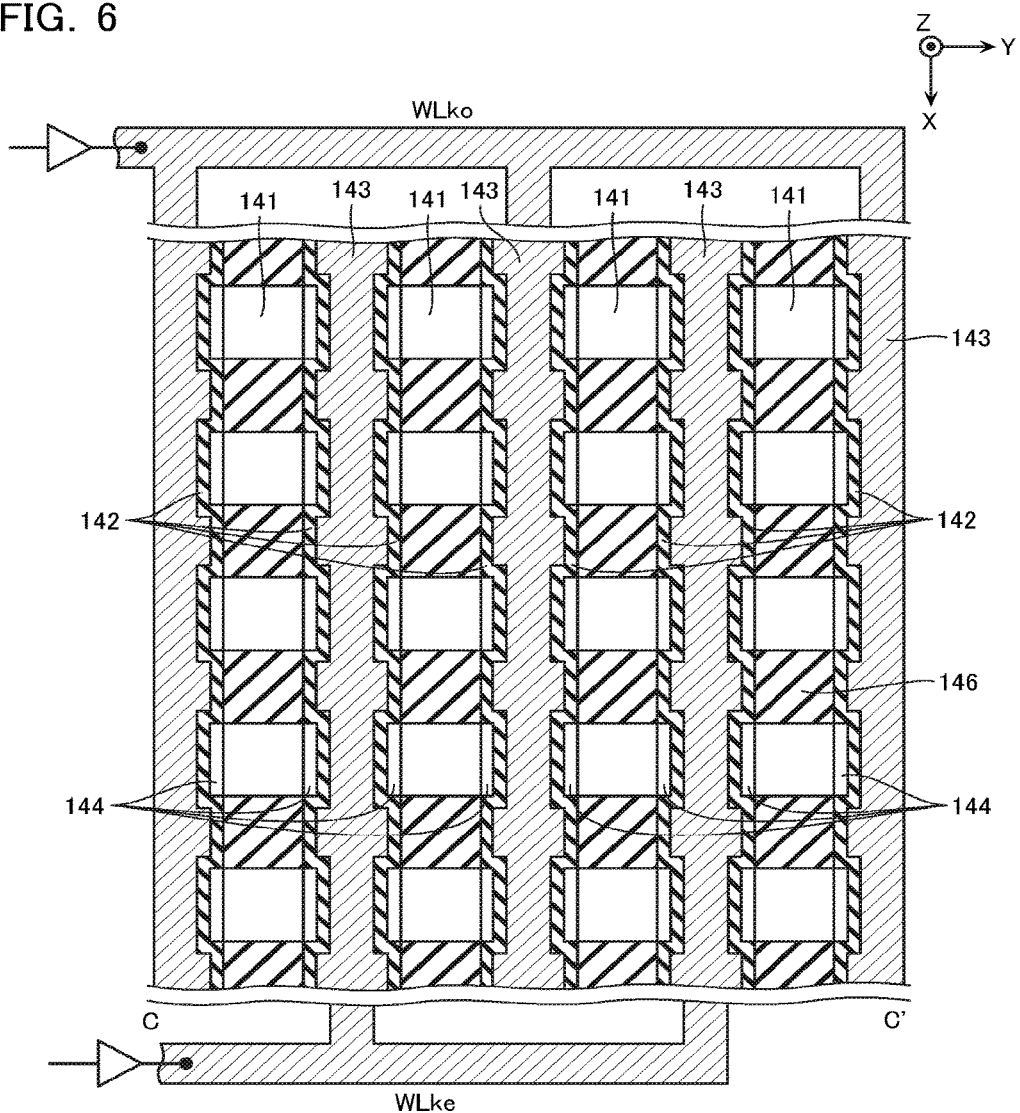
FIG. 6 is a cross-sectional view showing a configuration of part of the same nonvolatile semiconductor memory device.

Next, a more specific configuration example of the memory cell array 11 will be described with reference to FIGS. 3 to 6. FIG. 3 is a schematic perspective view showing a configuration example of part of the memory cell array 11. FIGS. 4 to 6 are schematic cross-sectional views showing configuration examples of part of the memory cell array 11, and show planes of the memory cell array 11 of FIG. 3 cut by A-A', B-B', and C-C', respectively. Note that in FIG. 3, part of the configuration is omitted. Moreover, the configurations shown in FIGS. 3 to 6 are merely examples, and specific configurations may be appropriately changed.

As shown in FIG. 3, the memory cell array 11 comprises: a substrate 110; and a bit line layer 120, a select gate transistor layer 130, and a memory layer 140 provided sequentially on the substrate 110. The bit line layer 120 functions as the plurality of bit lines $BL_1$ to $BL_5$. The select gate transistor layer 130 functions as the plurality of select gate transistors STr. The memory layer 140 functions as the plurality of memory strings MS and the word lines $WL_{1o}$ to $WL_{no}$ and $WL_{1o}$ to $WL_{no}$.

As shown in FIG. 3, the bit line layer 120 comprises a plurality of bit line conductive layers 121 provided in plurality in an X direction and extending in a Y direction. The bit line conductive layers 121 are formed from the likes of tungsten (W) or p type polysilicon, for example, and respectively function as the bit lines $BL_1$ to $BL_5$.

As shown in FIGS. 3 and 4, the select gate transistor layer 130 comprises: a plurality of channel layers 131 provided along an upper surface of the bit line conductive layer 121 and extending in a Z direction; a gate insulating layer 132 provided on a side surface in the Y direction of this channel layer 131; and a gate line conductive layer 133 facing the channel layer 131 via this gate insulating layer 132. The channel layer 131 is formed from a semiconductor of the likes of p type polysilicon, for example, and functions as a channel body of the select gate transistor STr. The gate insulating layer 132 is formed from an insulating layer of the likes of silicon oxide ($SiO_2$), for example, and functions as a gate insulating layer of the select gate transistor STr. The gate line conductive layer 133 is formed from a conductive layer of the likes of tungsten (W) or polysilicon, for example, and functions as a gate electrode of the select gate transistor STr and as the select gate lines $SG_1$ to $SG_5$.

As shown in FIG. 5, the plurality of channel layers 131 are provided in a matrix in the XY plane along upper surfaces of the plurality of bit line conductive layers 121. Moreover, the gate line conductive layers 133 each extend in the X direction and face, from the Y direction, via the gate insulating layer 132, the plurality of channel layers 131 provided in a line in the X direction. Note that an inter-layer insulating layer 134 formed from an insulating layer of the likes of silicon oxide ($SiO_2$), for example, is implanted between the channel layers 131 adjacent in the X direction.

As shown in FIGS. 3 and 4, the memory layer 140 comprises: a plurality of first semiconductor layers 141 extending in the Z direction and each connected at its lower end to the channel layer 131; a plurality of second semiconductor layers 144 provided in the Z direction along a side surface in the Y direction of this first semiconductor layer 141; and a variable resistance layer 142 and word line conductive layer 143 sequentially connected to side surfaces of these plurality of second semiconductor layers 144. In addition, as shown in FIG. 4, the plurality of second semiconductor layers 144, the variable resistance layer 142, and the word line conductive layer 143 adjacent in the Z direction are each insulated and isolated via an inter-layer insulating layer 145. The first semiconductor layer 141 is formed from the likes of p type polysilicon, for example, and functions as the first semiconductor layer SC1. The second semiconductor layer 144, contrary to the first semiconductor layer 141, is formed from the likes of n type polysilicon, for example, and functions as the second semiconductor layer SC2. The variable resistance layer 142 is formed from the likes of hafnium oxide (HfOx), for example, and functions as the variable resistance element VR (memory cell MC). The word line conductive layer 143 is formed from a conductive layer of the likes of tungsten (W) or polysilicon, for example, and functions as the word lines $WL_{1e}$ to $WL_{ne}$ and $WL_{1o}$ to $WL_{no}$. The inter-layer insulating layer 145 is formed from an insulating layer of the likes of silicon oxide ($SiO_2$), for example.

As shown in FIG. 6, the plurality of first semiconductor layers 141 are provided in a matrix in the XY plane. Moreover, the word line conductive layer 143 is formed in a comb tooth shape, and faces, from the Y direction, all of the first semiconductor layers 141 provided in a matrix. Furthermore, the second semiconductor layer 144 and the variable resistance layer 142 are respectively provided between the plurality of first semiconductor layers 141 and the word line conductive layer 143. Note that an inter-layer insulating layer 146 formed from an insulating layer of the likes of silicon oxide ($SiO_2$), for example, is implanted between the first semiconductor layers 141 adjacent in the X direction.

Next, the read operation and the write operation of the nonvolatile semiconductor memory device 1 according to the present embodiment will be described with reference to FIGS. 7 to 13. Note that hereafter, an operation that sets the variable resistance element VR to a low resistance state, of the write operation, will be called a setting operation, and an operation that sets the variable resistance element VR to a high resistance state, of the write operation will be called a resetting operation.

Figure 7:
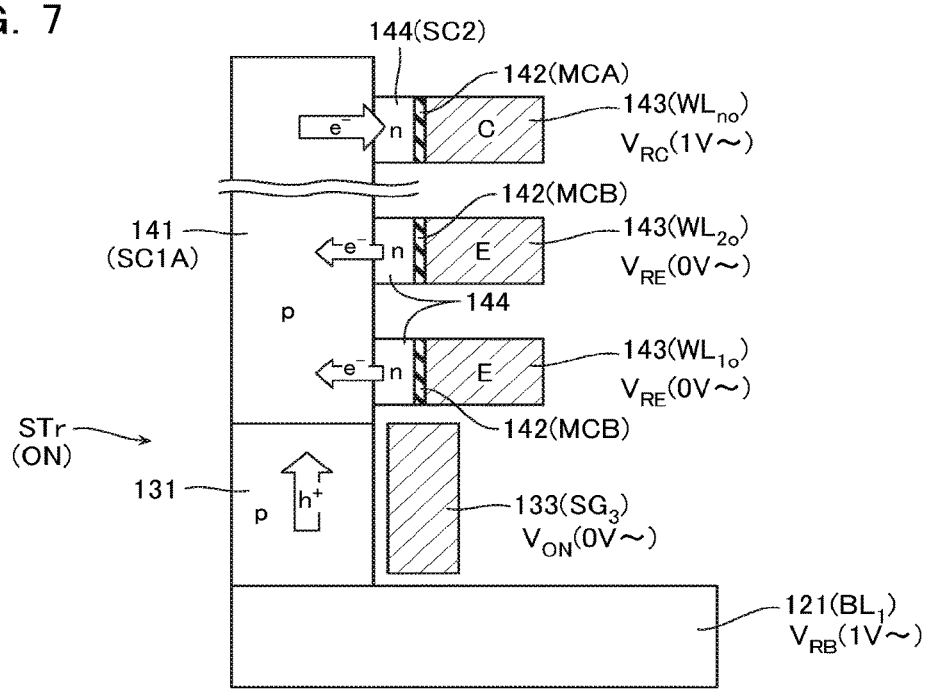
FIG. 7 is a cross-sectional view for explaining the read operation of the same nonvolatile semiconductor memory device.
Figure 8:
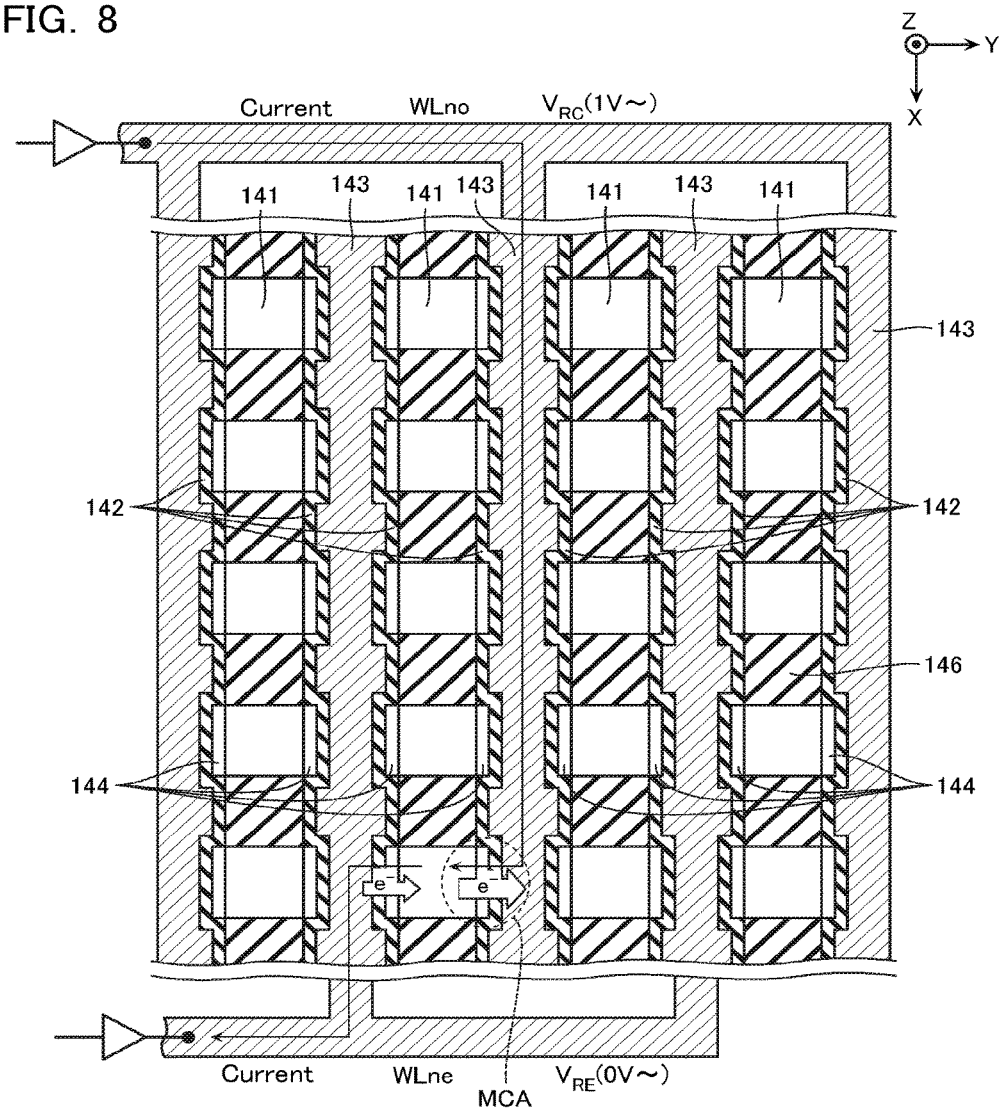
FIG. 8 is a cross-sectional view for explaining the same read operation.
Figure 9:
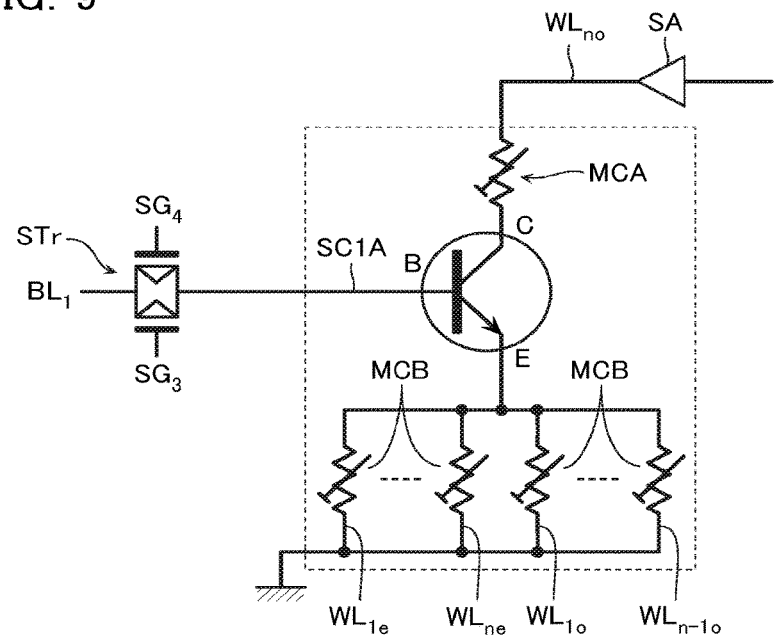
FIG. 9 is a schematic circuit diagram for explaining the same read operation.

First, the read operation of the nonvolatile semiconductor memory device 1 according to the present embodiment will be described with reference to FIGS. 7 to 9. FIG. 7 is a schematic cross-sectional view for explaining the same read operation, and shows a cross-section corresponding to part of FIG. 4. Moreover, FIG. 8 is a schematic cross-sectional view for explaining the same read operation, and shows a cross-section corresponding to FIG. 6. FIG. 9 is a schematic circuit diagram for explaining the same read operation. Note that in FIGS. 7 and 8, part of the configuration is omitted. Moreover, the description below describes the case of reading data from the selected memory cell MCA of the selected memory string MSA.

As shown in FIGS. 7 and 9, in the read operation, the control circuit 12 applies an on voltage $V_{ON}$ (about 0 V) to the gate line conductive layer 133 (select gate lines $SG_3$ and $SG_4$). As a result, as shown in FIG. 7, the select gate transistor STr attains an ON state.

In addition, as shown in FIGS. 7 and 9, the control circuit 12 applies a read base voltage $V_{RB}$ (about 1 V) to the bit line conductive layer 121 (selected bit line $BL_1$). As a result, holes $h^+$ are supplied from the bit line conductive layer 121 (selected bit line $BL_1$) to the first semiconductor layer 141 (first semiconductor layer SC1A), a voltage of the first semiconductor layer 141 (first semiconductor layer SC1A) is raised, and a plurality of the second semiconductor layers 144 (second semiconductor layers SC2) are electrically connected to each other. In other words, a bipolar transistor configured from the first semiconductor layer 141 and the second semiconductor layer 144 attains an ON state.

Moreover, as shown in FIGS. 7 to 9, the control circuit 12 applies a read emitter voltage $V_{RE}$ (about 0 V) to an unselected word line conductive layer 143 and a read collector voltage $V_{RC}$ (about 1 V) to a selected word line conductive layer 143. As a result, electrons $e^-$ move from a plurality of the unselected word lines $WL_{1e}$ to $WL_{ne}$ and $WL_{1o}$ to $WL_{n-1o}$ to the selected word line $WL_{no}$, via the selected memory cell MCA. Therefore, the control circuit 12 reads a current due to this movement of electrons $e^-$, by a sense amplifier SA (FIG. 9), and thereby determines a resistance state of the selected memory cell MCA and determines data stored in the selected memory cell MCA according to this resistance value.

Note that the read base voltage $V_{RB}$ and the read collector voltage $V_{RC}$ are set to a value larger than that of the read emitter voltage $V_{RE}$. Moreover, the read collector voltage $V_{RC}$ and the read emitter voltage $V_{RE}$ are set to a magnitude of a degree not causing a resistance value of the memory cell MC to change. Moreover, when, for example, the first semiconductor layer SC1 is formed from an n type semiconductor layer and the second semiconductor layer SC2 is formed from a p type semiconductor layer, the read base voltage $V_{RB}$ is set to a value smaller than that of the read emitter voltage $V_{RE}$.

Figure 10:
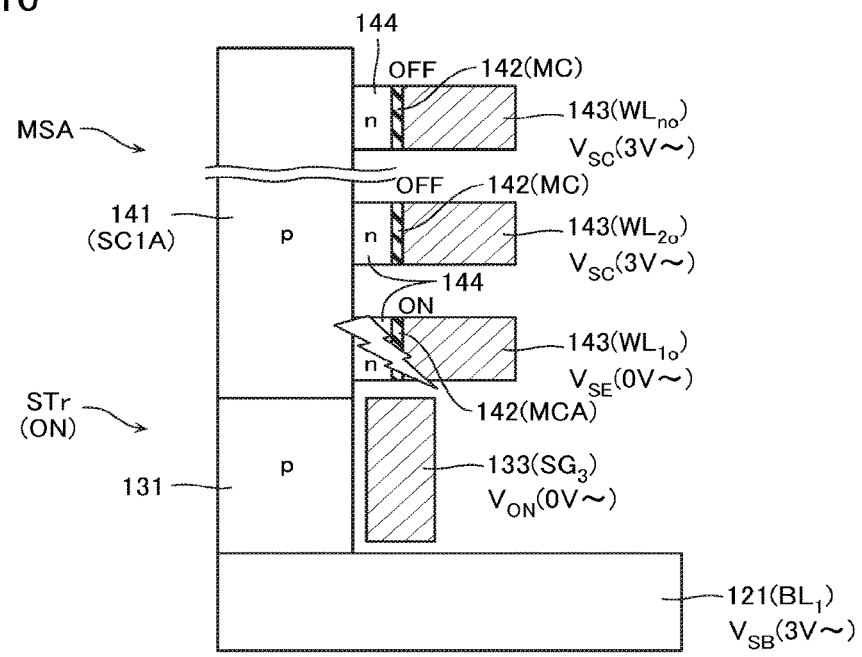
FIG. 10 is a cross-sectional view for explaining a setting operation of the same nonvolatile semiconductor memory device.
Figure 11:
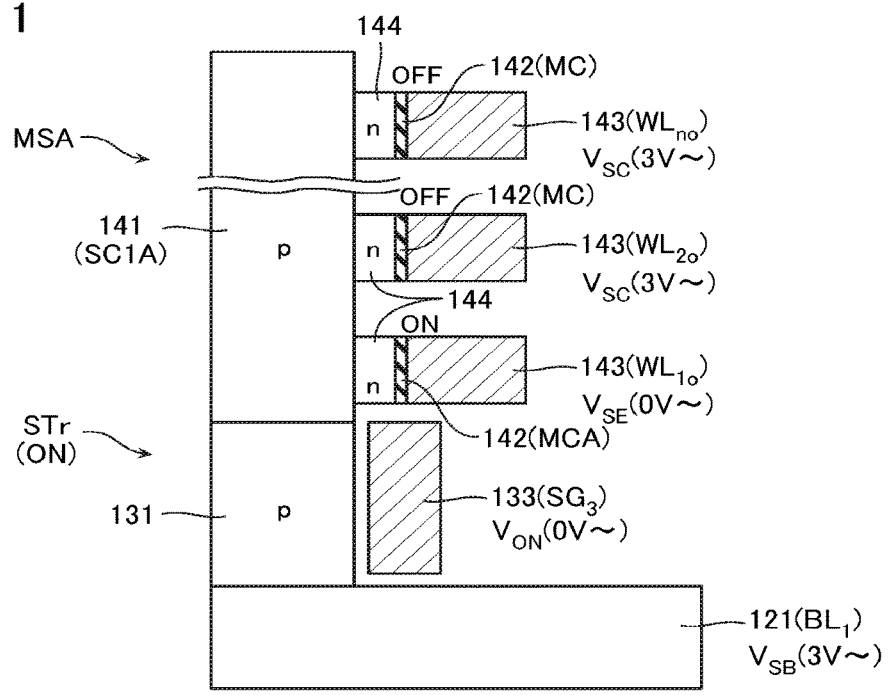
FIG. 11 is a cross-sectional view for explaining the same setting operation.
Figure 12:
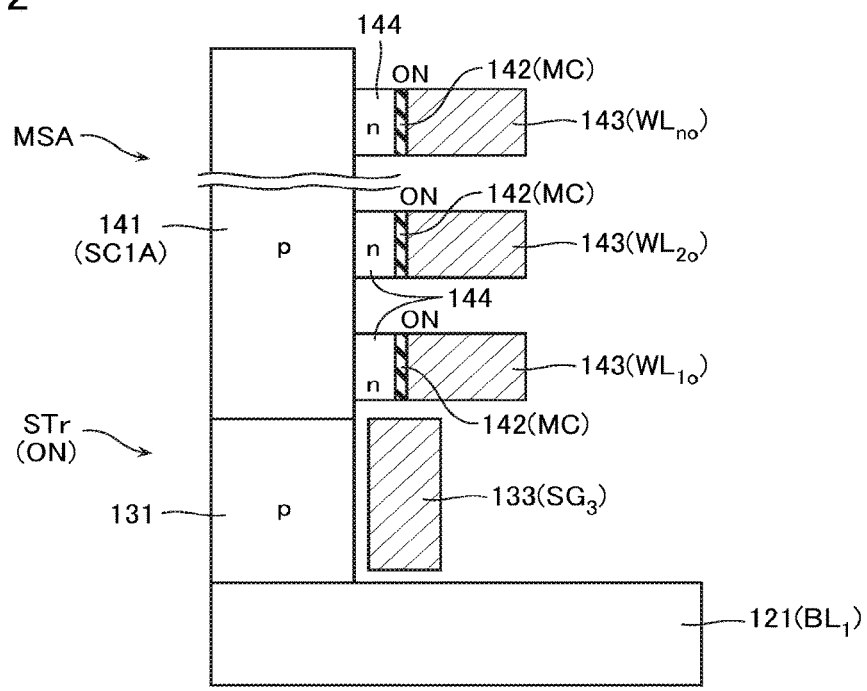
FIG. 12 is a cross-sectional view for explaining the same setting operation.

Next, the setting operation of the nonvolatile semiconductor memory device 1 according to the present embodiment will be described with reference to FIGS. 10 to 12. FIGS. 10 to 12 are schematic cross-sectional views for explaining the same setting operation. Note that in FIGS. 10 to 12, part of the configuration is omitted. Moreover, the description below describes an example where all of the memory cells MC of the selected memory string MSA are set to a low resistance state.

As shown in FIG. 10, in the setting operation, the control circuit 12 applies an on voltage $V_{ON}$ (about 0 V) to the gate line conductive layer 133 (select gate line $SG_3$), thereby setting the select gate transistor STr to an ON state, for example, similarly to in the case of the read operation.

In addition, as shown in FIG. 10, the control circuit 12 applies a setting base voltage $V_{SB}$ (about 3 V) to the bit line conductive layer 121 (selected bit line $BL_1$), thereby electrically connecting a plurality of the second semiconductor layers 144 (second semiconductor layers SC2).

Moreover, as shown in FIG. 10, the control circuit 12 applies a setting emitter voltage $V_{SE}$ (about 0 V) to a selected word line conductive layer 143 and a setting collector voltage $V_{SC}$ (about 3 V) to an unselected word line conductive layer 143. As a result, electrons $e^-$ move from the selected word line $W_{1o}$ to a plurality of the unselected word lines $WL_{1e}$ to $WL_{ne}$ and $WL_{2o}$ to $WL_{no}$, via the selected memory cell MCA, and, as shown in FIG. 11, the selected memory cell MCA attains a low resistance state (ON state).

Similarly thereafter, the control circuit 12 sequentially selects the memory cells MC in the selected memory string MSA, and applies the setting emitter voltage $V_{SE}$ (about 0 V)

to a selected word line WL connected to this selected memory cell MC and the setting collector voltage $V_{SC}$ (about 3 V) to an unselected word line WL. As a result, as shown in FIG. 12, all of the memory cells MC in the selected memory string MSA can be set to a low resistance state (ON state).

Note that the setting base voltage $V_{SB}$ and the setting collector voltage $V_{SC}$ are set to a value larger than that of the setting emitter voltage $V_{SE}$. Moreover, the setting collector voltage $V_{SC}$ and the setting emitter voltage $V_{SE}$ are set to a magnitude of a degree enabling transition of the memory cell MC from a low resistance state to a high resistance state. Moreover, when, for example, the first semiconductor layer SC1 is formed from an n type semiconductor layer and the second semiconductor layer SC2 is formed from a p type semiconductor layer, the setting base voltage $V_{SB}$ is set to a value smaller than that of the setting emitter voltage $V_{SE}$.

Figure 13:
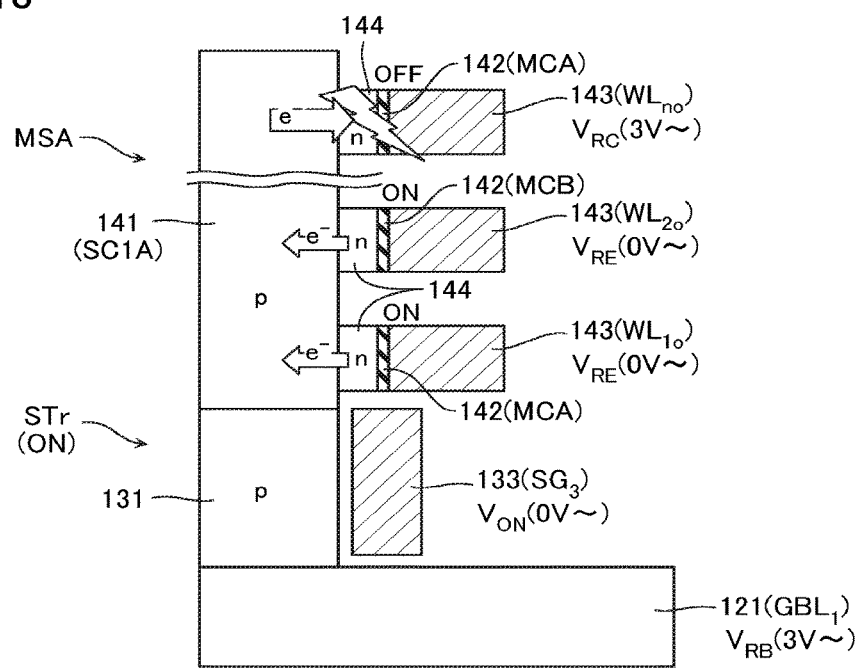
FIG. 13 is a cross-sectional view for explaining a resetting operation of the same nonvolatile semiconductor memory device.

Next, the resetting operation of the nonvolatile semiconductor memory device 1 according to the present embodiment will be described with reference to FIG. 13. FIG. 13 is a schematic cross-sectional view for explaining the same resetting operation. Note that in FIG. 13, part of the configuration is omitted.

As shown in FIG. 13, in the resetting operation, the control circuit 12 applies an on voltage $V_{ON}$ (about 0 V) to the gate line conductive layer 133 (select gate line $SG_3$), thereby setting the select gate transistor STr to an ON state, similarly to in the case of the read operation.

In addition, as shown in FIG. 13, the control circuit 12 applies a resetting base voltage $V_{RB}$ (about 3 V) to the bit line conductive layer 121 (selected bit line $BL_1$), thereby electrically connecting a plurality of the second semiconductor layers 144 (second semiconductor layers SC2).

Moreover, as shown in FIG. 13, the control circuit 12 applies a resetting collector voltage $V_{RC}$ (about 3 V) to a selected word line conductive layer 143 and a resetting emitter voltage $V_{RE}$ (about 0 V) to an unselected word line conductive layer 143. As a result, electrons e⁻ move from a plurality of the unselected word lines $WL_{1e}$ to $WL_{ne}$ and $WL_{1o}$ to $WL_{n-1o}$ to the selected word line $W_{no}$, via the selected memory cell MCA, and, as shown in FIG. 13, the selected memory cell MCA attains a high resistance state (OFF state).

Note that in the resetting operation, immediately after the selected memory cell MCA has undergone transition to a high resistance state, a voltage in the first semiconductor layer 141 is about the resetting base voltage $V_{RB}$ (3 V). Now, when the selected memory cell MCA undergoes transition to a high resistance state, electrons supplied from the unselected memory cell MCB in a low resistance state are accumulated in the first semiconductor layer 141. Therefore, a voltage in the first semiconductor layer 141 is suitably adjusted to a ground voltage (about 0 V).

Moreover, in the resetting operation, a voltage is applied also to the unselected memory cell MCB in the selected memory string MSA. However, a current does not flow in the unselected memory cell MCB in a high resistance state, for example, hence a high resistance state is maintained. Moreover, although a current flows in the unselected memory cell MCB in a low resistance state, this current flows in a direction that the memory cell MC attains a low resistance state, hence a low resistance state is maintained. Therefore, in the resetting operation, data of the unselected memory cell MCB in the selected memory string MSA is suitably stored.

Note that the resetting base voltage $V_{RB}$ and the resetting collector voltage $V_{RC}$ are set to a value larger than that of the resetting emitter voltage $V_{RE}$. Moreover, the resetting collector voltage $V_{RC}$ and the resetting emitter voltage $V_{RF}$ are set to a magnitude of a degree enabling transition of the memory cell MC from a low resistance state to a high resistance state. Moreover, when, for example, the first semiconductor layer SC1 is formed from an n type semiconductor layer and the second semiconductor layer SC2 is formed from a p type semiconductor layer, the resetting base voltage $V_{RB}$ is set to a value smaller than that of the resetting collector voltage $V_{RC}$.

Figure 14:
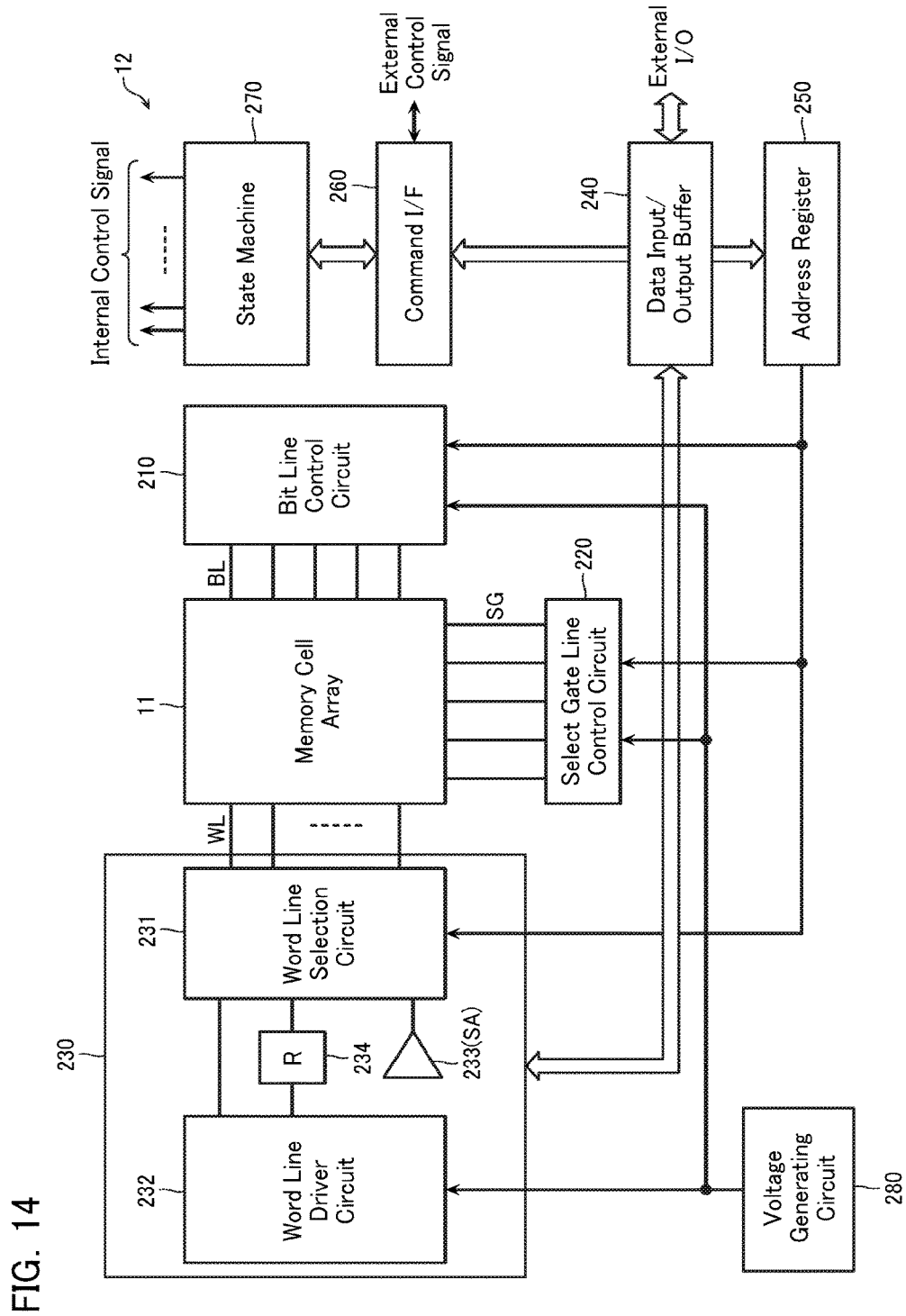
FIG. 14 is a block diagram for explaining a control circuit of the same nonvolatile semiconductor memory device.

Next, a configuration example of the control circuit 12 that controls the memory cell array 11 of the nonvolatile semiconductor memory device 1 according to the present embodiment will be described with reference to FIG. 14. FIG. 14 is a block diagram showing a schematic configuration example of the same control circuit 12.

As shown in FIG. 14, the control circuit 12 comprises: a bit line control circuit 210 that performs control of the bit line BL; a select gate line control circuit 220 that performs control of the select gate line SG; and a word line control circuit 230 that performs control of the word line WL. The bit line control circuit 210, the select gate line control circuit 220, and the word line control circuit 230 transfer desired voltages to a desired bit line BL, select gate line SG, and word line WL, based on inputted address data.

As shown in FIG. 14, the word line control circuit 230 comprises: a word line selection circuit 231; a word line driver circuit 232; and a sense amplifier 233. The word line selection circuit 231, on the basis of address data, selects one or a plurality of the word lines WL as a selected word line WL, and another of the plurality of word lines WL as an unselected word line WL, and these selected word line WL and unselected word line WL are connected to another circuit in the word line control circuit 230. The word line driver circuit 232 supplies a certain voltage to each of the selected word line WL and the unselected word line WL selected by the word line selection circuit 231. The sense amplifier 233 is configured capable of connection to a desired word line WL, and, for example, during the read operation, is connected to the selected word line WL and detects a current flowing in the selected word line WL.

In addition, as shown in FIG. 14, a series resistance 234 may be provided between the word line selection circuit 231 and the word line driver circuit 232. For example, during the setting operation, the selected word line WL or unselected word line, and so on, and the word line driver circuit 232 are connected via this series resistance 234. As a result, a rapid increase in current accompanying the selected memory cell MC being made low resistance can be suppressed, and the unselected memory cell MC in the selected memory string MS can be prevented from being made high resistance.

Moreover, as shown in FIG. 14, the control circuit 12 comprises an address register 250 that supplies address data to the bit line control circuit 210, the select gate line control circuit 220, and the word line selection circuit 231.

In addition, as shown in FIG. 14, the control circuit 12 comprises a voltage generating circuit 280 that supplies a voltage to the memory cell array 1, via the bit line control circuit 210, the select gate line control circuit 220, and the word line driver circuit 232. The voltage generating circuit 280 generates and outputs a voltage of a certain magnitude at a certain timing.

Moreover, as shown in FIG. 14, the control circuit 12 comprises a state machine 270 that inputs an internal control signal to the likes of the voltage generating circuit 280. The state machine 270 receives command data from the host 2 and performs management of read, write, input/output of data, and so on.

In addition, as shown in FIG. 14, the control circuit 12 comprises a data input/output buffer 240 which is connected to the external host 2 via an I/O line. The data input/output buffer 240 receives user data from the external host 2, and transfers the user data to the word line control circuit 230. Moreover, the data input/output buffer 240 receives command data from the external host 2, and transfers the command data to a command interface 260. In addition, the data input/output buffer 240 receives address data from the external host 2, and transfers the address data to the address register 250. Furthermore, the data input/output buffer 240 receives user data from the sense amplifier 233, and transfers the user data to the external host 2.

Moreover, as shown in FIG. 14, the control circuit 12 comprises the command interface 260 that receives an external control signal from the external host 2. The command interface 260 determines which of user data, command data, and address data data inputted to the data input/output buffer 240 is, based on the external control signal inputted from the external host 2, and controls the data input/output buffer 240. In addition, the command interface 260 transfers to the state machine 270 command data received from the data input/output buffer 240.

Next, a method of manufacturing the nonvolatile semiconductor memory device 1 according to the present embodiment will be described with reference to FIGS. 15 to 25. FIGS. 15 to 25 are schematic cross-sectional views for explaining the same method of manufacturing; FIGS. 15 to 17, 19, 22, and 24 show cross-sections corresponding to FIG. 4; and FIGS. 18, 20, 21, 23, and 25 show cross-sections corresponding to FIG. 6.

Figure 15:
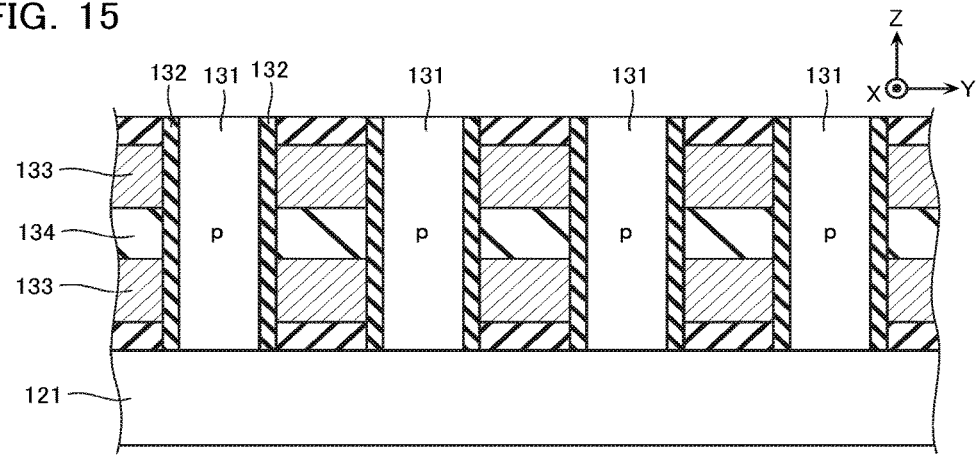
FIG. 15 is a cross-sectional view for explaining a method of manufacturing the same nonvolatile semiconductor memory device.

In the method of manufacturing according to the present embodiment, first, as shown in FIG. 15, the bit line layer 120 and the select gate transistor layer 130 described with reference to FIGS. 3 to 6, are formed. The bit line layer 120 and the select gate transistor layer 130 can be formed by a variety of methods.

Figure 16:
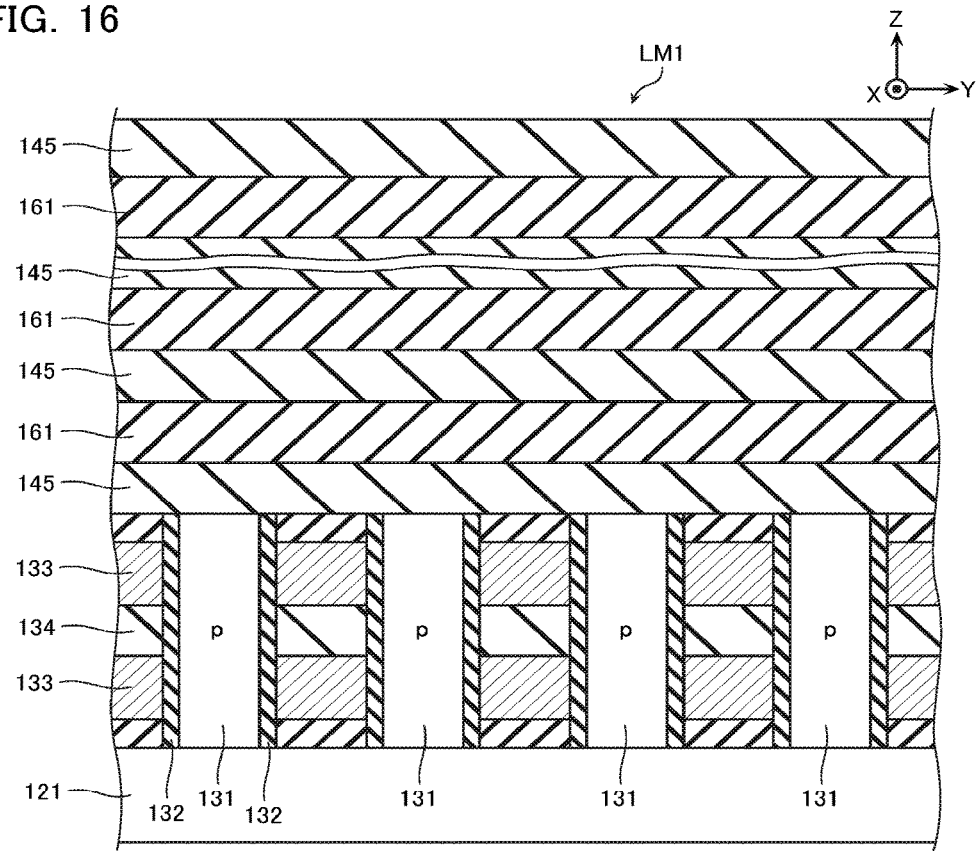
FIG. 16 is a cross-sectional view for explaining the same method of manufacturing.

Next, as shown in FIG. 16, an inter-layer insulating layer 145 and a sacrifice layer 161 are stacked alternately on the select gate transistor layer 130, and a stacked body LM1 is formed. The inter-layer insulating layer 145 is formed from an insulating layer of the likes of silicon oxide ($SiO_2$), for example. The sacrifice layer 161 is formed from an insulating layer of the likes of silicon nitride (SiN), for example. Note that the inter-layer insulating layer 145 and the sacrifice layer 161 are formed using a means such as CVD (Chemical Vapor Deposition), for example.

Figure 17:
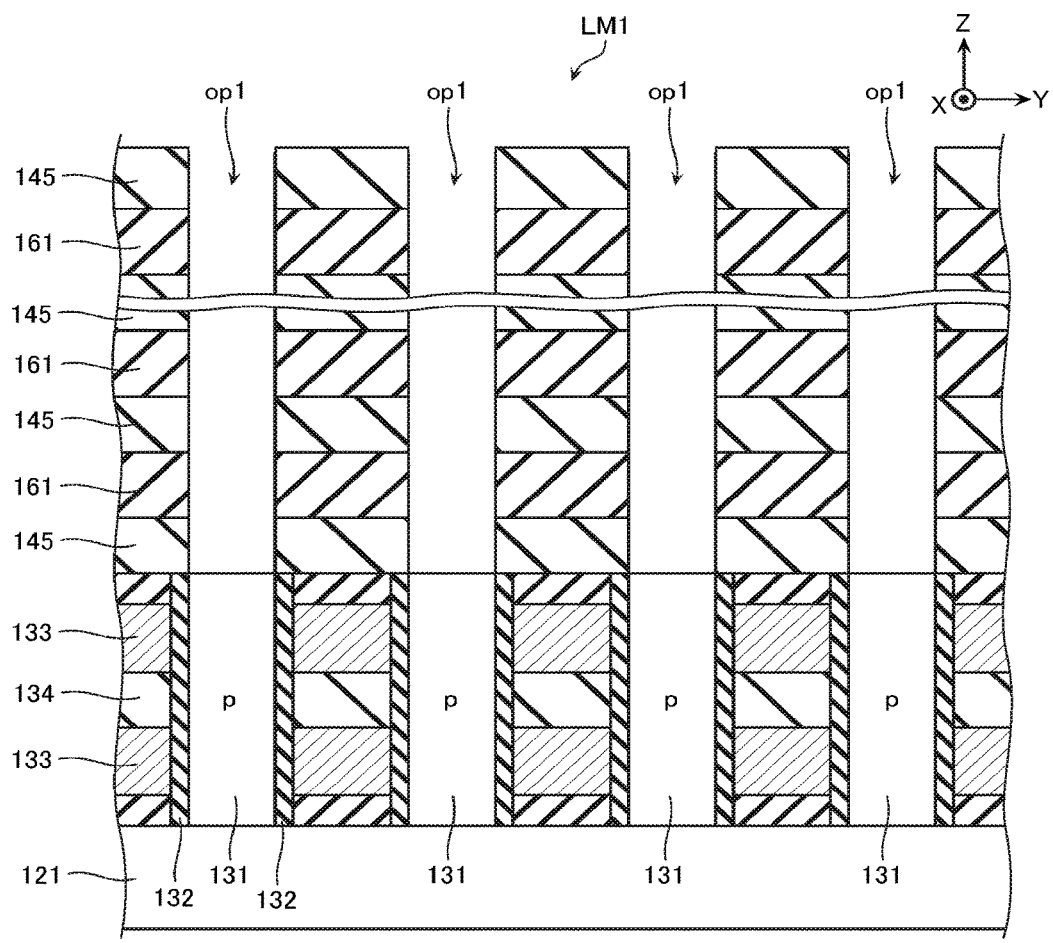
FIG. 17 is a cross-sectional view for explaining the same method of manufacturing.
Figure 18:
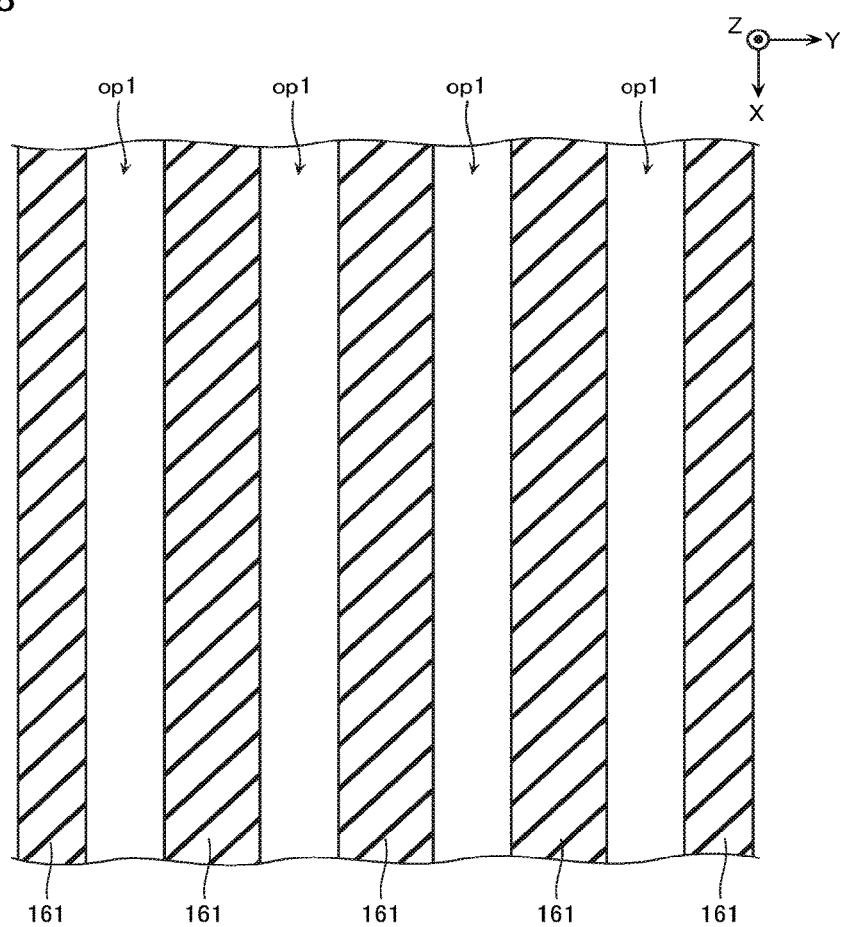
FIG. 18 is a cross-sectional view for explaining the same method of manufacturing.

Next, as shown in FIGS. 17 and 18, a trench op1 is formed in the stacked body LM1. A plurality of the trenches op1 are formed in the Y direction, and each of the trenches op1 extends in the X direction. Moreover, a channel layer 131 of the select gate transistor layer 130 is exposed at a bottom surface of the trench op1. Note that formation of the trench op1 is performed using a means such as RIE (Reactive Ion Etching), for example.

Figure 19:
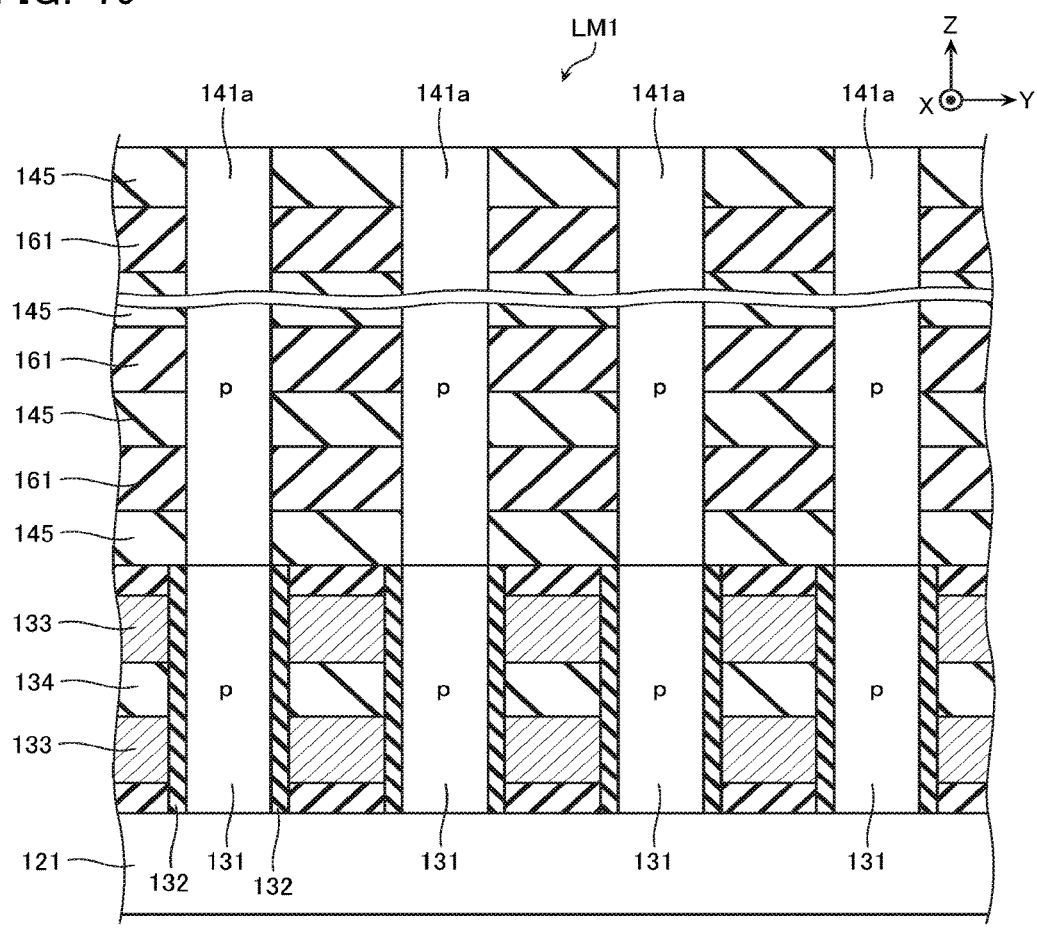
FIG. 19 is a cross-sectional view for explaining the same method of manufacturing.
Figure 20:
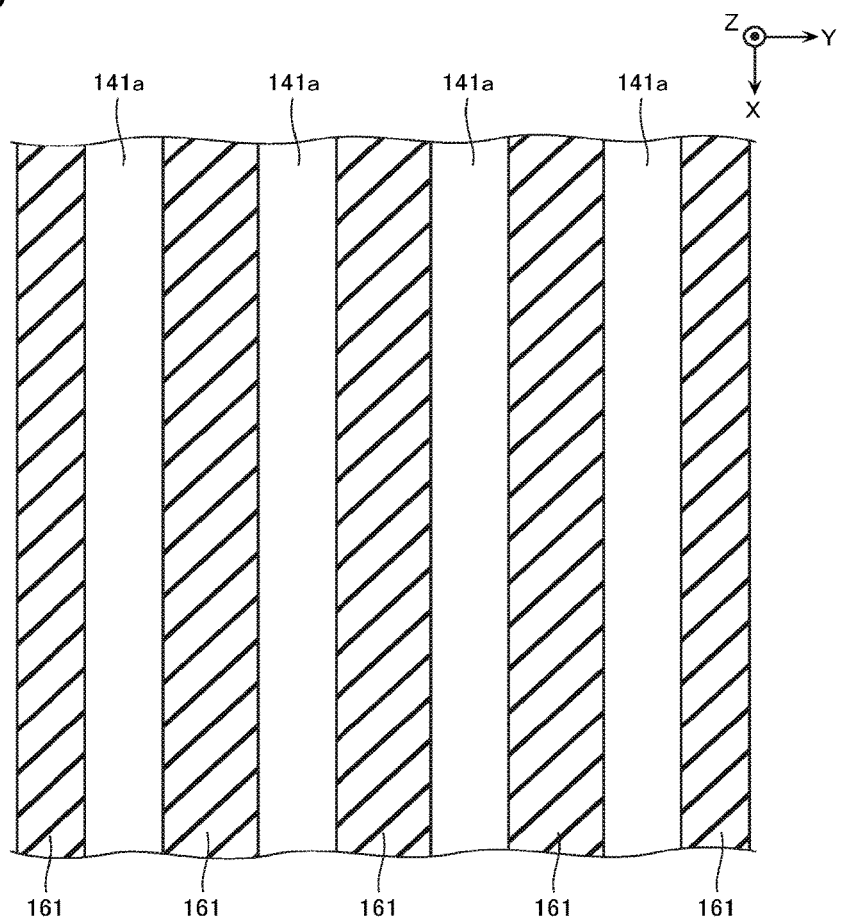
FIG. 20 is a cross-sectional view for explaining the same method of manufacturing.

Next, as shown in FIGS. 19 and 20, a silicon layer 141a forming the first semiconductor layer 141 is formed in the trench op1 of the stacked body LM1. The silicon layer 141a is formed from, for example, polysilicon including a p type impurity. The silicon layer 141a is formed by, for example, depositing amorphous silicon including a p type impurity by a means such as epitaxial growth and configuring the amorphous silicon as polysilicon by heat treatment.

Figure 21:
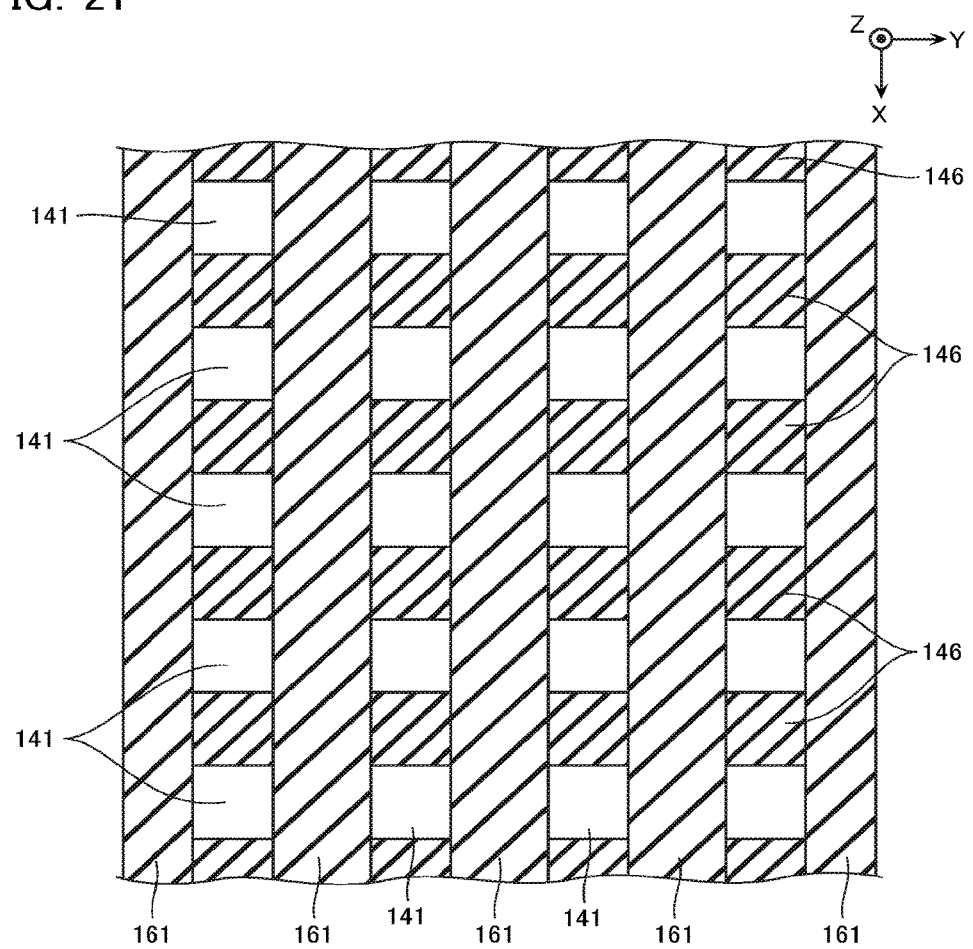
FIG. 21 is a cross-sectional view for explaining the same method of manufacturing.

Next, as shown in FIG. 21, the silicon layer 141a extending in the X direction is divided in the X direction, and the first semiconductor layer 141 is formed. In addition, an insulating layer 146 is formed between the first semiconductor layers 141 adjacent in the X direction. The insulating layer 146 is formed from an insulating layer of the likes of silicon oxide ($SiO_2$), for example. Division of the silicon layer 141a is performed using a means such as RIE (Reactive Ion Etching), for example. Moreover, the insulating layer 146 is formed using a means such as CVD (Chemical Vapor Deposition), for example.

Figure 22:
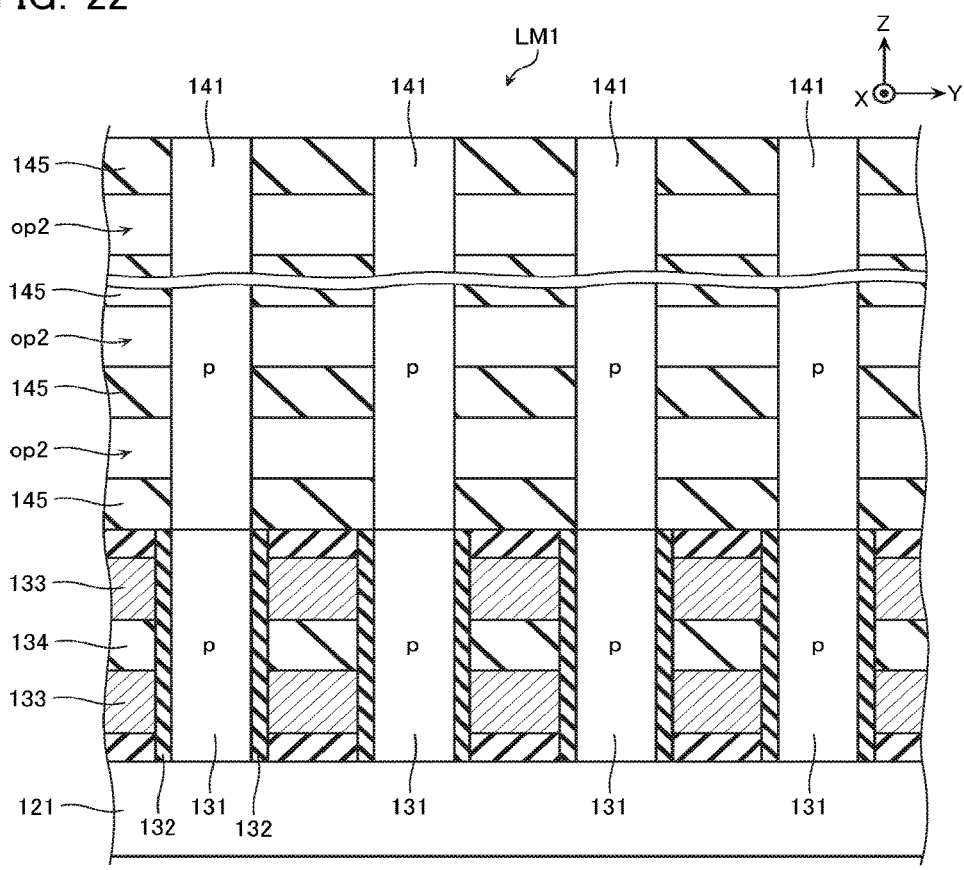
FIG. 22 is a cross-sectional view for explaining the same method of manufacturing.
Figure 23:
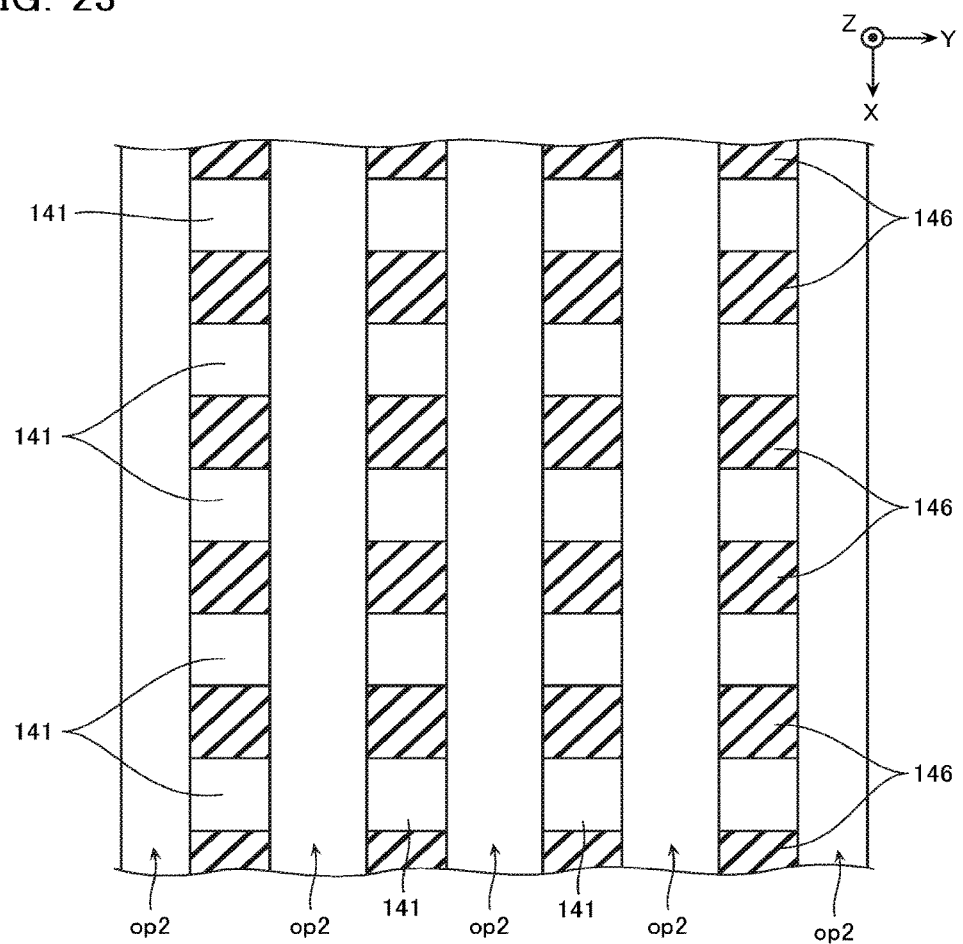
FIG. 23 is a cross-sectional view for explaining the same method of manufacturing.

Next, as shown in FIGS. 22 and 23, the sacrifice layer 161 is removed, and an opening op2 is formed. As shown in FIG. 23, a side surface in the Y direction of the first semiconductor layer 141 is exposed in the opening op2. Removal of the sacrifice layer 161 is performed by the likes of wet etching using phosphoric acid, for example.

Figure 24:
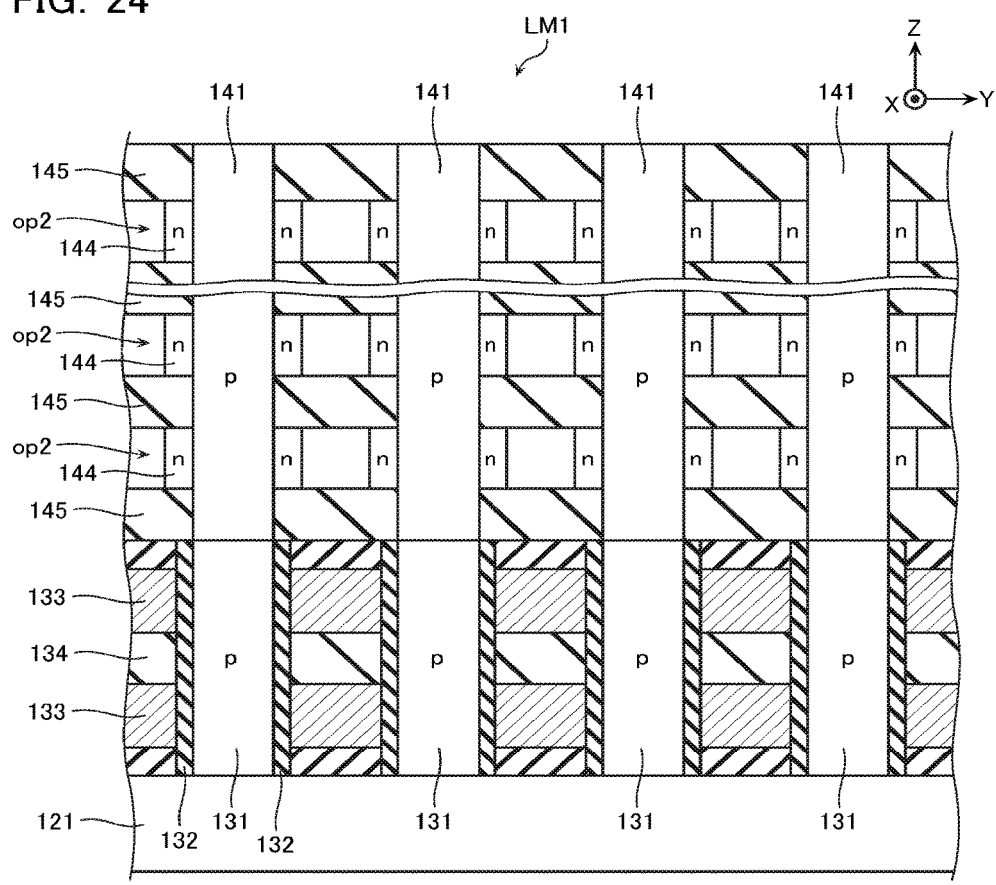
FIG. 24 is a cross-sectional view for explaining the same method of manufacturing.
Figure 25:
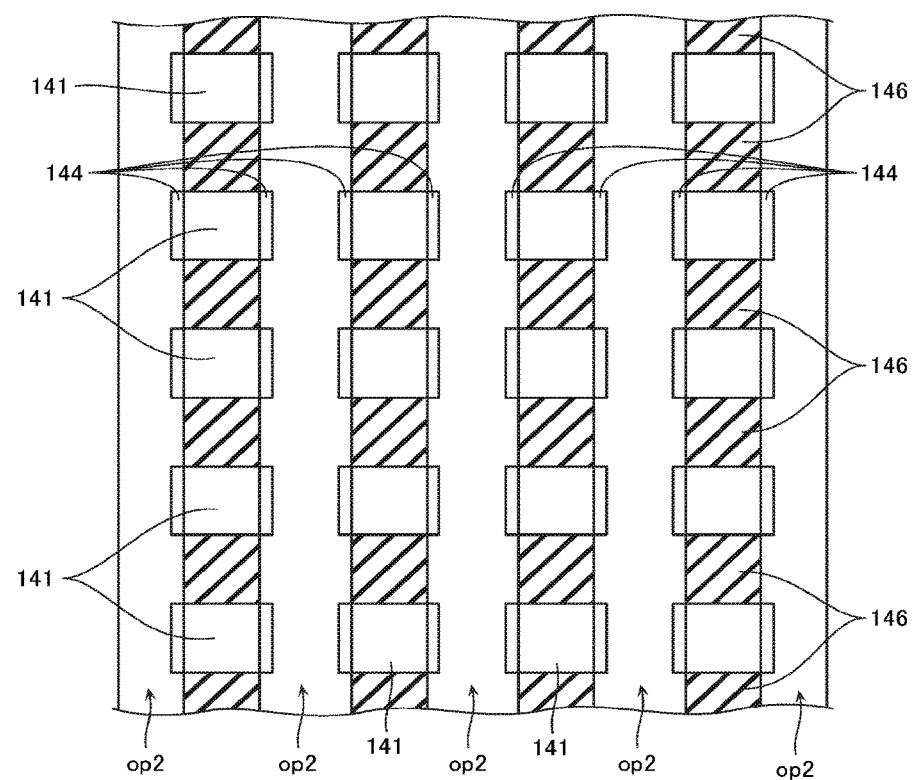
FIG. 25 is a cross-sectional view for explaining the same method of manufacturing.

Next, as shown in FIGS. 24 and 25, the second semiconductor layer 144 is formed on a side surface of the first semiconductor layer 141, via the opening op2. The second semiconductor layer 144 is formed from, for example, polysilicon including an n type impurity. The second semiconductor layer 144 is formed by, for example, depositing amorphous silicon including an n type impurity by a means such as epitaxial growth and configuring the amorphous silicon as polysilicon by heat treatment. Note that deposition of the amorphous silicon is performed under such a condition that the amorphous silicon is more preferentially deposited on a sidewall of polysilicon than on a sidewall of silicon oxide ($SiO_2$), for example.

Next, as shown in FIGS. 4 and 6, the variable resistance layer 142 is formed on a sidewall of the second semiconductor layer 144 via the opening op2, and the word line conductive layer 143 is formed so as to fill in the opening op2. The variable resistance layer 142 is formed from the likes of hafnium oxide (HfOx), for example. The word line conductive layer 143 is formed from a conductive layer of the likes of tungsten (W) or polysilicon, for example. The variable resistance layer 142 and the word line conductive layer 143 are formed using a means such as CVD (Chemical Vapor Deposition), for example.

Other Embodiments

Figure 26:
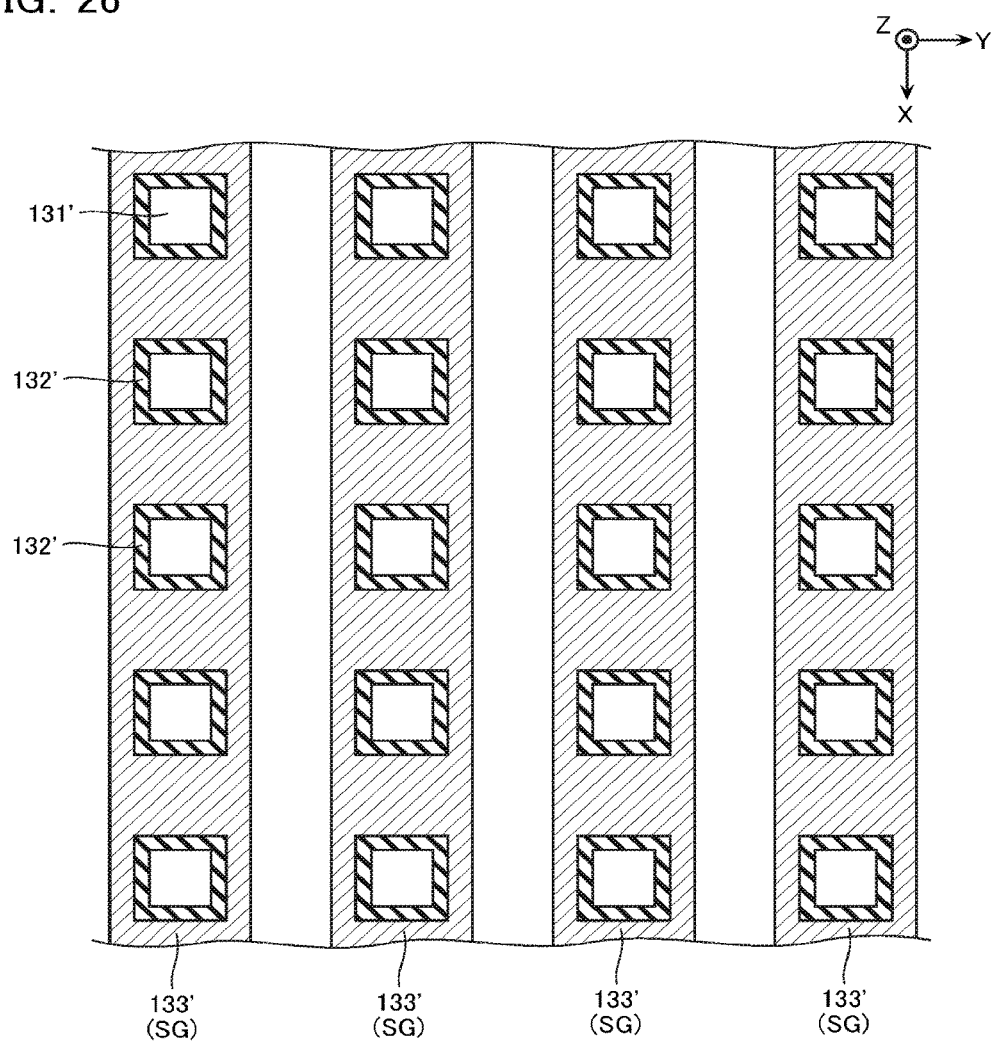
FIG. 26 is a cross-sectional view showing a configuration of part of a nonvolatile semiconductor memory device according to another embodiment.

As described with reference to FIG. 5, in the select gate transistor layer 130 according to the first embodiment, the gate line conductive layer 133 faced the plurality of channel layers 131 from the Y direction. However, the select gate transistor STr may adopt a different configuration. For example, as shown in FIG. 26, there may be adopted a configuration such that a gate line conductive layer 133' surrounds, via a gate insulating layer 132', a plurality of channel layers 131' provided in a line in the X direction. Note that in other respects, the channel layer 131', the gate insulating layer 132', and the gate line conductive layer 133' are configured similarly to the channel layer 131, the gate insulating layer 132, and the gate line conductive layer 133 according to the first embodiment.

Figure 27:
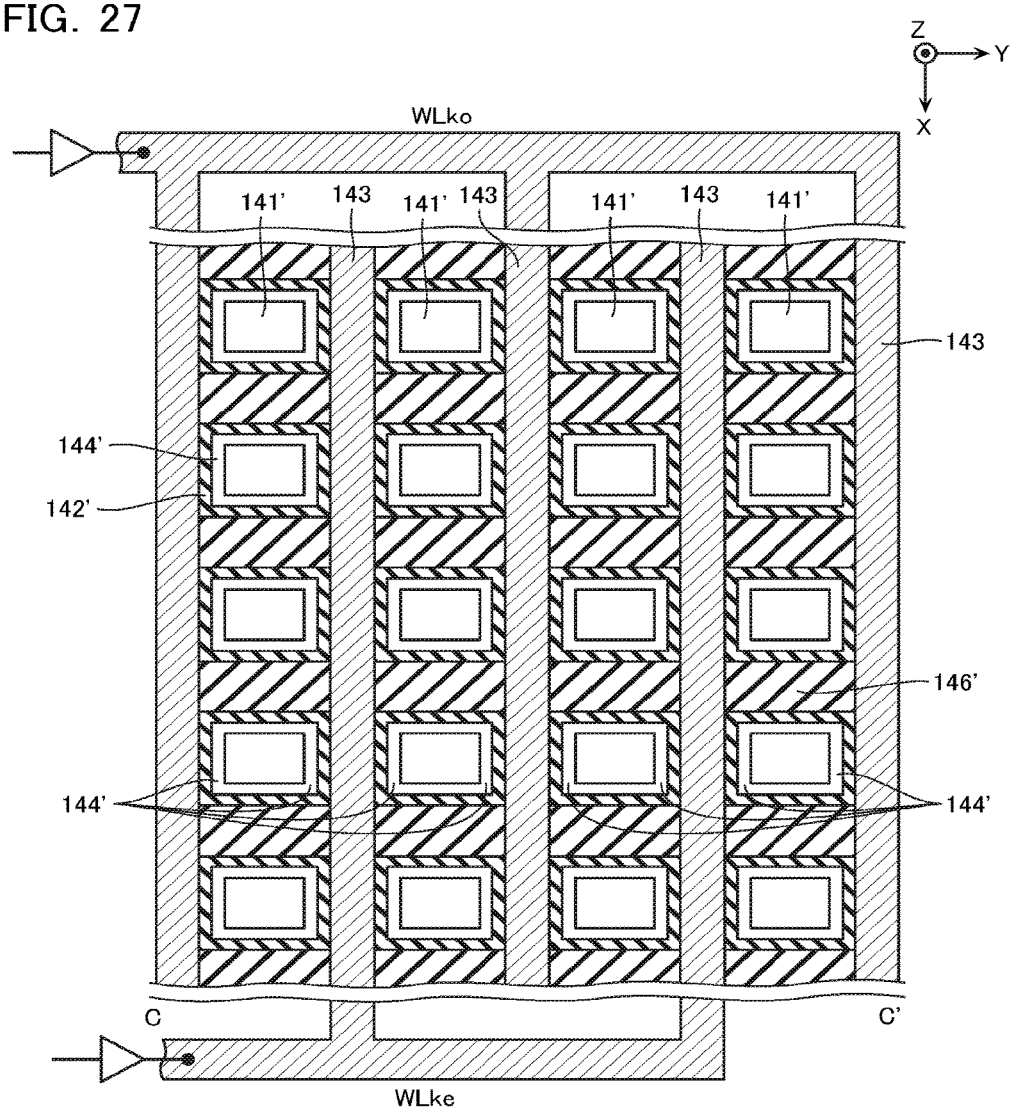
FIG. 27 is a cross-sectional view showing a configuration of part of a nonvolatile semiconductor memory device according to another embodiment.
Figure 28:
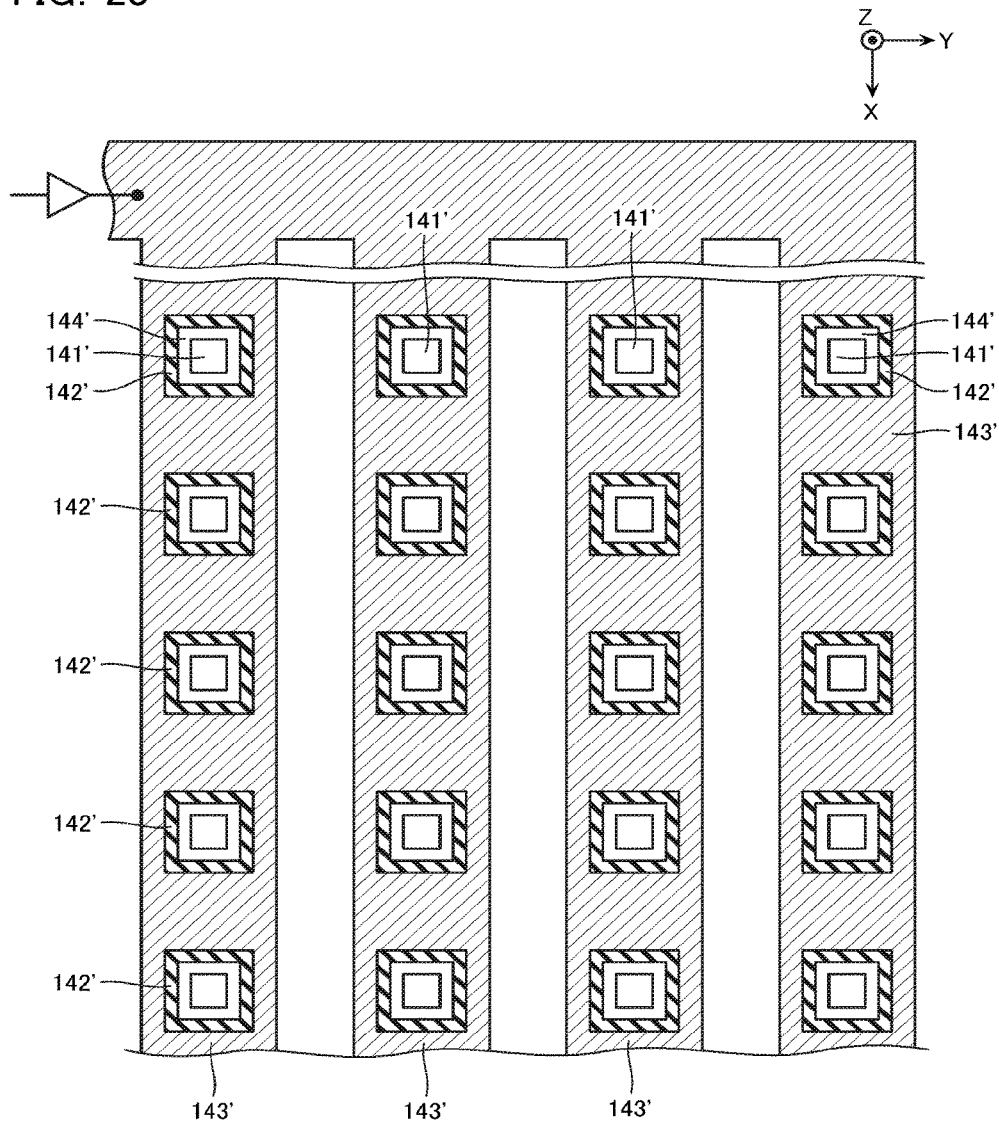
FIG. 28 is a cross-sectional view showing a configuration of part of a nonvolatile semiconductor memory device according to another embodiment.

In addition, as described with reference to FIG. 6, the word line conductive layer 143 according to the first embodiment faced the first semiconductor layer 141 from the Y direction, and the second semiconductor layer 144 and the variable resistance layer 142 were respectively provided between these first semiconductor layer 141 and word line conductive layer 143. However, for example, as shown in FIG. 27, a side surface in the X direction and side surface in the Y direction of a first semiconductor layer 141' may be covered by a second semiconductor layer 144' and a variable resistance layer 142' Moreover, for example, as shown in FIG. 28, a word line conductive layer 143' may cover the side surface in the X direction and side surface in the Y direction of the first semiconductor layer 141', via the variable resistance layer 142' and the second semiconductor layer 144'. Note that in other respects, the variable resistance layer 142', the word line conductive layer 143', and the second semiconductor layer 144' are configured similarly to the variable resistance layer 142, the word line conductive layer 143, and the second semiconductor layer 144 according to the first embodiment.

Others

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
a first wiring line;
a memory string connected to the first wiring line; and
a plurality of second wiring lines connected to the memory string,
the memory string comprising:
a first semiconductor layer connected to the first wiring line;
a plurality of second semiconductor layers connected to the first semiconductor layer; and
a variable resistance element connected between the second semiconductor layer and the second wiring line,
the first semiconductor layer including a semiconductor of a first conductivity type, and
the plurality of second semiconductor layers including a semiconductor of a second conductivity type.

2. The semiconductor memory device according to claim 1, further comprising
a select gate transistor connected between the first wiring line and the memory string,
wherein the select gate transistor comprises a channel body including a semiconductor of the first conductivity type.

3. The semiconductor memory device according to claim 1, further comprising
a sense amplifier configured capable of connection to the second wiring line.

4. The semiconductor memory device according to claim 1, further comprising:
a series resistance; and
a driver configured capable of connection to the second wiring line via the series resistance.

5. The semiconductor memory device according to claim 1, wherein
the first semiconductor layer includes a p type semiconductor,
the plurality of second semiconductor layers include an n type semiconductor,
the semiconductor memory device further comprises a control circuit connected to the first wiring line and the plurality of second wiring lines, and
the control circuit
applies a first voltage to the second wiring line connected to a first variable resistance element,
applies a second voltage larger than the first voltage, to the second wiring line connected to a second variable resistance element, and
applies a third voltage larger than the first voltage, to the first wiring line.

6. The semiconductor memory device according to claim 5, wherein
the control circuit
comprises a sense amplifier, and
detects a current flowing in the second wiring line connected to the second variable resistance element, using the sense amplifier.

7. The semiconductor memory device according to claim 1, wherein
the first semiconductor layer includes an n type semiconductor,
the plurality of second semiconductor layers include a p type semiconductor,
the semiconductor memory device further comprises a control circuit connected to the first wiring line and the plurality of second wiring lines, and
the control circuit
applies a fourth voltage to the second wiring line connected to a first variable resistance element,
applies a fifth voltage larger than the fourth voltage, to the second wiring line connected to a second variable resistance element, and
applies a sixth voltage smaller than the fifth voltage, to the first wiring line.

8. The semiconductor memory device according to claim 7, wherein
the control circuit
comprises a sense amplifier, and
detects a current flowing in the second wiring line connected to the second variable resistance element, using the sense amplifier.

9. The semiconductor memory device according to claim 1, wherein
the first semiconductor layer extends in a first direction perpendicular to a substrate,
a plurality of the second semiconductor layers are provided in the first direction along the first semiconductor layer,
the variable resistance element is connected to the second semiconductor layer from a second direction parallel to the substrate, and
the second wiring line is connected to the variable resistance element from the second direction.

10. A semiconductor memory device, comprising:
a plurality of first wiring lines;
a plurality of select gate transistors connected to the first wiring line;
a plurality of memory strings respectively connected to the plurality of select gate transistors; and
a plurality of second wiring lines connected to the memory string,
the memory string comprising:
a first semiconductor layer connected to the select gate transistor:
a plurality of second semiconductor layers connected to the first semiconductor layer; and a variable resistance element connected between the second semiconductor layer and the second wiring line, the first semiconductor layer including a semiconductor of a first conductivity type, and the plurality of second semiconductor layers including a semiconductor of a second conductivity type.

11. The semiconductor memory device according to claim 10, wherein the select gate transistor comprises a channel body including a semiconductor of the first conductivity type.

12. The semiconductor memory device according to claim 10, further comprising a control circuit connected to the first wiring line, the plurality of second wiring lines, and a control gate of the select gate transistor, wherein the control circuit selectively applies a voltage to the first semiconductor layer of a selected memory string to which a certain variable resistance element belongs.

13. The semiconductor memory device according to claim 10, wherein the first semiconductor layer includes a p type semiconductor, the plurality of second semiconductor layers include an n type semiconductor, the semiconductor memory device further comprises a control circuit connected to the first wiring line, the plurality of second wiring lines, and a control gate of the select gate transistor, and the control circuit sets a first select gate transistor to an on state, and a second select gate transistor to an off state, applies a first voltage to the second wiring line connected to a first variable resistance element, applies a second voltage larger than the first voltage, to the second wiring line connected to a second variable resistance element, and applies a third voltage larger than the first voltage, to the first wiring line.

14. The semiconductor memory device according to claim 13, wherein the control circuit comprises a sense amplifier, and detects a current flowing in the second wiring line connected to the second variable resistance element, using the sense amplifier.

15. The semiconductor memory device according to claim 10, wherein the first semiconductor layer includes an n type semiconductor, the plurality of second semiconductor layers include a p type semiconductor, the semiconductor memory device further comprises a control circuit connected to the first wiring line, the plurality of second wiring lines, and a control gate of the select gate transistor, and the control circuit sets a first select gate transistor to an on state, and a second select gate transistor to an off state, applies a fourth voltage to the second wiring line connected to a first variable resistance element, applies a fifth voltage larger than the fourth voltage, to the second wiring line connected to a second variable resistance element, and applies a sixth voltage smaller than the fifth voltage, to the first wiring line.

16. The semiconductor memory device according to claim 13, wherein the control circuit comprises a sense amplifier, and detects a current flowing in the second wiring line connected to the second variable resistance element, using the sense amplifier.

17. The semiconductor memory device according to claim 10, wherein the first semiconductor layer extends in a first direction perpendicular to a substrate, a plurality of the second semiconductor layers are provided in the first direction along the first semiconductor layer, the variable resistance element is connected to the second semiconductor layer from a second direction parallel to the substrate, and the second wiring line is connected to the variable resistance element from the second direction.

* * * * *